United States Patent
Shajii et al.

(10) Patent No.: US 6,610,968 B1
(45) Date of Patent: Aug. 26, 2003

(54) SYSTEM AND METHOD FOR CONTROLLING MOVEMENT OF A WORKPIECE IN A THERMAL PROCESSING SYSTEM

(75) Inventors: Ali Shajii, Canton, MA (US); Brian Matthews, Somerville, MA (US); Jeffrey P. Hebb, Jamaica Plain, MA (US); John Danis, North Reading, MA (US)

(73) Assignee: Axcelis Technologies, Beverly, MA (US)

( * ) Notice: Subject to any disclaimer, the term of this patent is extended or adjusted under 35 U.S.C. 154(b) by 190 days.

(21) Appl. No.: 09/670,712

(22) Filed: Sep. 27, 2000

(51) Int. Cl.$^7$ .................................................. H05B 1/02
(52) U.S. Cl. ........................ 219/497; 219/486; 219/494; 219/492; 392/416; 374/102
(58) Field of Search ................................. 219/497, 506, 219/492, 501, 486, 494; 392/416; 374/101, 102, 120

(56) References Cited

U.S. PATENT DOCUMENTS

| | | | |
|---|---|---|---|
| 4,120,582 A | 10/1978 | De Vries et al. | 356/73 |
| 4,647,774 A | 3/1987 | Brisk et al. | 250/338 |
| 4,647,775 A | 3/1987 | Stein | 250/338 |
| 4,708,493 A | 11/1987 | Stein | 374/128 |
| 4,880,314 A | 11/1989 | Kienitz | 374/129 |
| 4,919,542 A | 4/1990 | Nulman et al. | 374/9 |
| 4,956,538 A | 9/1990 | Moslehi | 219/121.6 |
| 5,282,017 A | 1/1994 | Kasindorf et al. | 356/446 |
| 5,308,161 A | 5/1994 | Stein | 374/5 |
| 5,310,260 A | 5/1994 | Schietinger et al. | 374/142 |
| 5,318,362 A | 6/1994 | Schietinger et al. | 374/142 |
| 5,490,728 A | 2/1996 | Schietinger et al. | 374/7 |
| 5,597,237 A | 1/1997 | Stein | 374/9 |
| 5,704,712 A | 1/1998 | Stein | 374/126 |
| 5,820,366 A | 10/1998 | Lee | 432/241 |
| 5,900,177 A | * 5/1999 | Lecouras et al. | 219/497 |
| 6,303,411 B1 | * 10/2001 | Camm et al. | 438/149 |
| 6,407,368 B1 | * 6/2002 | Hsu et al. | 219/390 |

OTHER PUBLICATIONS

J. F. Hebb et al., "In Situ Wafer Emissivity Measurement in a Furnace Heated RTP System," *Proceedings of the 5$^{th}$ International Conference on Advanced Thermal Processing of Semiconductors,* New Orleans, Louisiana, pp. 1–9 (Sep. 3–5, 1997).

* cited by examiner

*Primary Examiner*—Mark Paschall
(74) *Attorney, Agent, or Firm*—Lahive & Cockfield, LLP

(57) ABSTRACT

A system and method for processing a workpiece in a thermal processing furnace by measuring the temperature of the workpiece in the thermal processing furnace, and based upon an intended temperature profile and the measured temperature of the workpiece, moving the workpiece through the furnace to heat process the workpiece generally according to the intended temperature profile.

44 Claims, 10 Drawing Sheets

SYSTEM AND METHOD FOR CONTROLLING MOVEMENT OF A WORKPIECE IN A THERMAL PROCESSING SYSTEM

BACKGROUND OF THE INVENTION

The present invention relates to a system and method for processing a workpiece, such as a semiconductor workpiece, and more particularly relates to a system and method for controlling the temperature of the workpiece in a thermal processing system.

Thermal processing systems or furnaces have been widely known and used for many years to perform a variety of semiconductor fabrication processes, including annealing, diffusion, oxidation, and chemical vapor deposition. As a result, these processes are well understood, especially with regard to the impact of process variables on the quality and uniformity of resulting products. Thermal processing furnaces typically employ either a horizontal-type furnace or a vertical-type furnace. For some applications, vertical-type furnaces are preferred because they create less particles during use, thus decreasing the incidence of contamination and workpiece waste, they can be easily automated, and they require less floor space because of their relatively small footprint.

Both conventional types of furnaces are designed to heat semiconductor wafers to desired temperatures to promote either diffusion of implanted dopants to a desired depth or to perform other conventional processing techniques, such as the application of an oxide layer to the wafer or deposition of a chemical vapor layer to the wafer. The heating requirements of the wafer are generally important and thus are closely monitored.

Conventional vertical-type thermal processing furnaces, such as tube furnaces, are designed to support the processing tube within the furnace in the vertical position. The thermal furnace also typically employs a wafer boat assembly which is mounted to appropriate translation mechanisms for moving the wafer boat into and out of the processing tube. A wafer-handling assembly is deployed adjacent and parallel to the wafer-boat assembly to transfer the semiconductor wafers from wafer cassettes to the wafer-boat assembly. The wafers are then raised into a quartz or silicon heating tube. The tube is then slowly raised to the desired temperature and maintained at that temperature for some pre-determined period of time. Afterwards, the tube is slowly cooled, and the wafers removed from the tube to complete the processing. A drawback of this processing technique is that it places constraints on the time-at-temperature to which a wafer can be subjected. Conventional vertical furnaces of these and other types are shown and described in U.S. Pat. No. 5,217,501 of Fuse et al. and in U.S. Pat. No. 5,387,265 of Kakizaki et al.

Another problem with conventional thermal processing systems is that the heating or processing regimen to which the wafer is subjected does not closely match a standard pre-established heating profile due to system constraints. For example, prior systems employ multiple pyrometers to measure temperature at various furnace locations, and then use the multiple signals generated by the pyrometers to control operation of multiple heating units, such as lamps. The system cycles the lamps on and off according to the system's heating requirements. This heating control arrangement introduces unwanted noise in the system and generally makes it difficult to process a wafer in accordance with the pre-established heating profile.

There thus exists a need in the art for a thermal processing system that accurately controls wafer heating in accordance with a temperature or heating profile.

Other general and more specific objects of the invention will in part be obvious and will in part appear from the drawings and description which follow.

SUMMARY OF THE INVENTION

The present invention achieves the foregoing with a system and method for processing a workpiece in a thermal processing furnace. According to the present invention, the method includes the steps of measuring the temperature of the workpiece in the thermal processing furnace, and based upon the intended temperature profile and the measured temperature of the workpiece, moving the workpiece through the furnace to heat process the workpiece generally according to the intended temperature profile.

According to one aspect, the invention includes the step of providing an intended temperature profile of the workpiece to be generally achieved during processing in the thermal processing furnace. The method also allows a user to determine one or more selected set points of the thermal processing furnace, which are then used to construct the intended temperature profile.

According to another aspect, the method of the invention employs the step of moving the workpiece through the furnace based upon the furnace set points, the intended temperature profile and the measured temperature of the workpiece. According to another aspect, the method includes the steps of providing a wafer processing recipe, generating from said recipe the intended temperature profile, and controlling movement of the workpiece in the furnace to heat the workpiece generally according to the temperature profile. The workpiece is moved by using an elevator subsystem in response to the measured temperature of the workpiece. The recipe can include one or more of a temperature ramp-up rate, a temperature ramp-down rate, and a soak temperature.

According to another aspect, the invention includes the steps of determining the emissivity of the workpiece, and based upon the emissivity of the workpiece, determining the temperature of the workpiece. The temperature can be measured by providing an emissivity compensated pyrometry system.

According to still another aspect, the workpiece temperature is determined with a feedback subsystem for detecting and measuring the wafer temperature. According to one practice, the temperature is measured by determining the emissivity of the wafer, generating an output signal with a pyrometer indicative of the wafer temperature, filtering the output signal, and based on the wafer emissivity and the output signal, determining the wafer temperature. A control facility is provided for controlling movement of the wafer within the thermal processing furnace in response to the measured wafer temperature. The control facility performs this function by determining the difference between the measured temperature and the temperature profile to form an error signal, and moving the wafer within the furnace with an elevator subsystem. The control facility can also optionally perform the steps of scaling the error value, sampling the temperature profile at one or more points, determining the boundary conditions of the elevator subsystem, and moving the wafer at a selected speed within the chamber.

The present invention also provides a system for processing a workpiece. The system includes a thermal processing furnace having a process chamber, a feedback subsystem coupled to the thermal processing furnace for detecting a parameter of the workpiece when disposed in the processing chamber, a control facility for generating a control signal based upon an intended temperature profile of the workpiece and the parameter of the workpiece, and an elevator subsystem in communication with the control facility for moving the workpiece through the process chamber in response to the control signal to heat process the workpiece generally according to the intended temperature profile. The control facility is adapted to control the elevator subsystem to move the workpiece along an intended path through the processing chamber as a function of the intended temperature profile.

The system can also include a user interface for providing a wafer processing recipe that includes a temperature ramp-up rate, a temperature ramp-down rate, and/or a soak temperature. The system can also employ a trajectory generator for generating the intended temperature profile in response to the recipe.

According to one aspect, the control facility generates the control signal to move the workpiece through the furnace based upon the furnace set points, the intended temperature profile, and the measured temperature of the workpiece. According to one practice, the measured temperature of the workpiece is determined using the wafer thermal properties.

According to another aspect, the feedback subsystem includes a pyrometer for measuring the temperature of the workpiece, an emissivity measurement stage for measuring the emissivity of the wafer, and a filtering stage for filtering one of the measured temperature and emissivity, wherein the feedback subsystem generates a signal corresponding to the filtered temperature of the workpiece.

According to another aspect, the system can also include a plurality of thermocouples for measuring the temperature of the furnace at one or more locations. A furnace modeling stage generates an output signal corresponding to the actual measured temperature of the thermocouples in response to an input signal generated by the thermocouples, which is representative of the thermal properties of the furnace. An optional wafer temperature modeling stage for generating one or more signals indicative of one or more parameters (such as the raw emissivity and temperature values) of the workpiece in response to a workpiece position signal generated by the elevator subsystem and the output signal of the furnace thermal modeling stage.

Other general and more specific objects of the invention will in part be obvious and will in part be evident from the drawings and description which follow.

BRIEF DESCRIPTION OF THE DRAWINGS

The foregoing and other objects, features and advantages of the invention will be apparent from the following description and apparent from the accompanying drawings, in which like reference characters refer to the same parts throughout the different views. The drawings illustrate principles of the invention and, although not to scale, show relative dimensions.

DESCRIPTION OF ILLUSTRATED EMBODIMENTS

The present invention provides a wafer processing system that employs a control facility for controlling the temperature of the wafer by moving the wafer within a thermal processing furnace in response to a single control input, such as the measured wafer temperature. The wafer processing system further provides for generating an intended temperature profile based on a given wafer processing recipe, and controlling movement of the wafer with the control facility to achieve the intended temperature profile. The present invention is thus an adaptive processing system that predicts wafer temperature during processing and then controls the wafer position based on the actual measured temperature.

Figure 1:
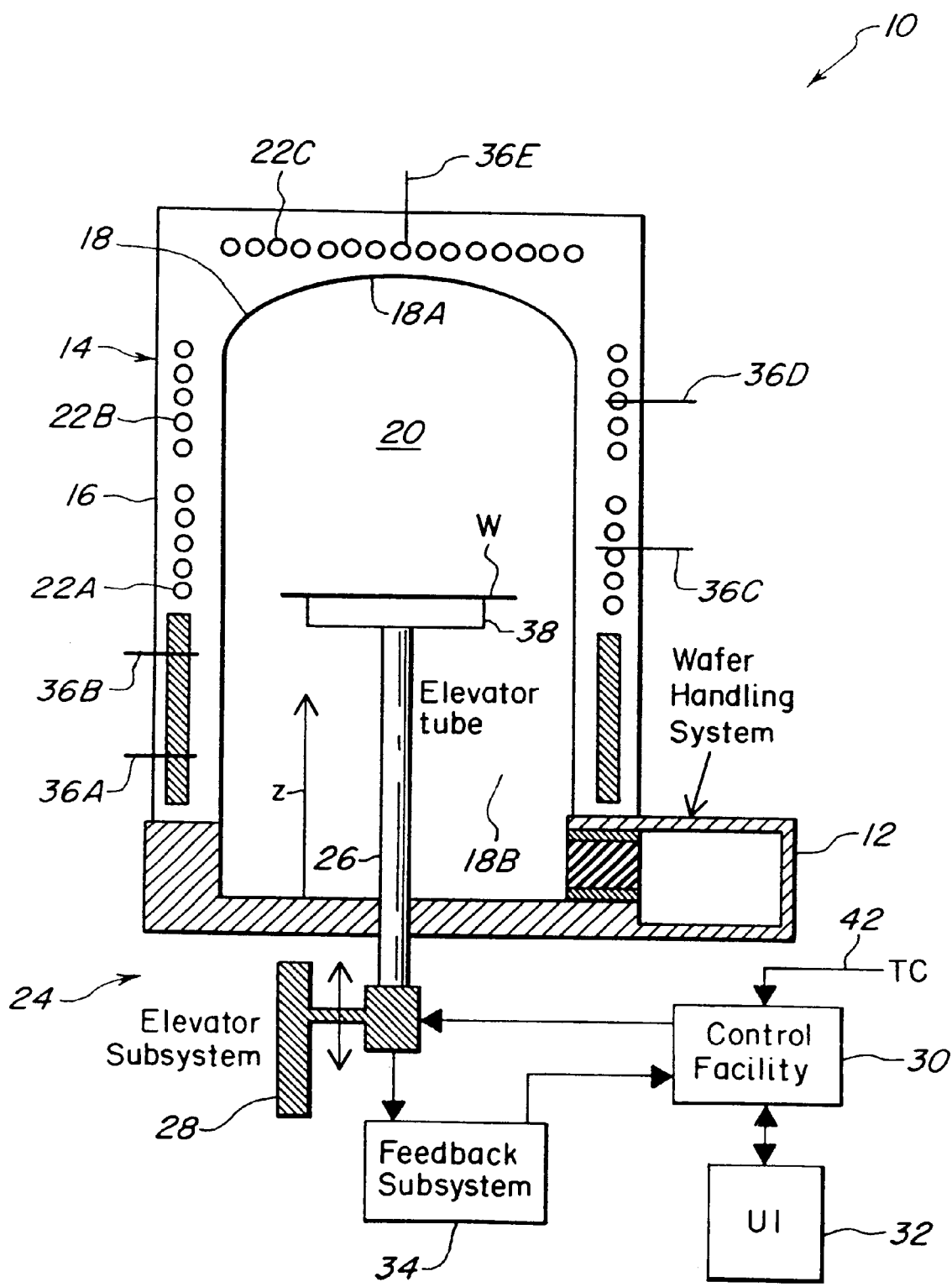
FIG. 1 is a perspective view of a wafer processing system employing a control system for controlling movement of a wafer in thermal processing furnace according to the teachings of the present invention.

FIG. 1 illustrates a wafer processing system 10 in accord with the teachings of the present invention. The illustrated wafer processing system 10 includes a wafer handling system 12 that is adapted to load a wafer into, and conversely remove a wafer from, a thermal processing system 14, in accord with known techniques. The illustrated thermal processing system 14 includes a main outer housing 16 that encloses a vertical furnace having a cylindrical process tube 18 that has a closed end 18A and an opposed open end 18B. The cylindrical tube 18 defines a heating or process chamber 20. The process tube 18 can be used as a constant or continuous heat source. As used herein, the word "continuous" is intended to include continuous both in temperature and heating surface area. The process tube 18 can be formed of any high temperature material such as alumina, silicon carbide, and other suitable ceramic materials.

The process tube 18 can be surrounded by a three zone resistive heating module comprising three suitable heating element 22A, 22B, and 22C that use resistance-heated elements or RF heated black body cavity susceptors as the primary heat source. This particular type of heat source is simple to implement, well characterized and widely accepted as a reliable technique for stable and uniform control of the furnace temperature. According to one embodiment, the heating elements forms part of a heater module that is a vertically oriented, three zone resistive heating unit. The heating elements can be composed of low mass, high temperature metallic wires. The insulation surrounding the heating element can be composed of ceramic fibers of high insulation value and low thermal mass. All are designed for fast responses to temperature changes. The module can also include an air cooling system to help cool the processing chamber 20. The process tube 18 diameter and thus the size of the vertical furnace can be easily scaled to accommodate wafers of varying sizes.

The illustrated thermal processing system 14 can be any suitable thermal processing furnace that is adapted for the thermal processing of silicon wafers at selected temperatures. According to a preferred practice, the illustrated thermal processing system 14 incorporates a rapid thermal processing furnace sold under the trade names of Summit or Reliance by Eaton Thermal Processing Systems Division, USA. The Summit design system is particularly advantageous since it is a single wafer furnace that achieves high repeatability and uniform results with relatively low maintenance requirements. The thermal processing furnace develops a temperature gradient by using a 'hot wall' vertical processing chamber 20 for single wafer processing instead of multiple lamp banks. This hot wall chamber is developed by disposing the heater module at the top of the furnace and a cooling system (not shown) at the bottom 18B of the chamber, thereby creating a temperature gradient from the top of the process chamber to the bottom. A smooth temperature gradient from top to bottom of the process chamber 74 is formed, with the top of the bell jar substantially approaching a black body radiator. With the temperature profile of the heating chamber or furnace fixed, the desired temperature is achieved by simply adjusting the position of the wafer W within the processing chamber 20. The wafer temperature ramp up and ramp down rates are controlled by the velocity with which the wafer is vertically moved through the temperature gradient within the chamber. Those of ordinary skill will also recognize that one or more heating or cooling stages can be provided, in addition to the illustrated single system 14. The selected ramp rates and elevator speeds determine the overall heating and cooling rates of the wafer.

The illustrated wafer processing system 10 employs a series of thermocouples, such as thermocouples 36A–36E, that are distributed about the furnace to measure the furnace temperature. The thermocouples measure temperature at selected locations for subsequent use by the control facility 30. The control facility can establish a selected thermal gradient along the process tubes, and the output signals (e.g., spike settings) generated by the thermocouples can be sampled to ensure that the desired temperature gradient is maintained. The temperature measurements from the thermocouples can be used to assist the system in determining certain selected furnace set points prior to processing each wafer. For example, before wafer processing begins, a thermal gradient along the process tube 18 is established by adjusting the heating elements 22A–22C until the required thermocouple set points are reached. Typically, the thermocouple set points are adjusted so that the top of the belljar is disposed at a temperature, such as 200° C., higher than the desired wafer processing temperature. The heating elements continue to be actively controlled through the thermocouple measurements during wafer processing to maintain a stable thermal environment.

The heating elements 22A, 22B, and 22C are arranged about the process tube 18 to heat the processing chamber 20 to a predetermined temperature, e.g., 400° C. to 1200° C. in the case of chemical vapor deposition, or 800° C. to 1200° C. in the case of oxidation or diffusion. The control facility 30 can be used to regulate the temperature of the process tube 18 according to the exigencies of the processing technique. For example, according to one practice, a temperature sensor, such as an optical pyrometer, can be used to sense the chamber temperature and can be coupled to the control facility 30 for providing a signal that can be correlated to wafer temperature. The heating unit preferably forms an isothermal heating zone within the processing chamber 20, as is known in the art.

The illustrated wafer handling system 12 can include any suitable wafer transport assemblies for loading and unloading a wafer on the elevator subsystem 24. An example of one type of wafer handling system is described in U.S. Pat. No. 5,820,366, the contents of which are herein incorporated by reference. The elevator subsystem 24 can include a quartz wafer holder 36 that sits on a wafer elevator tube 26 that slidably engages a guide rod 28. A suitable servo motor (not shown) can be coupled to the guide rod or elevator for selectively moving the elevator vertically along the guide rod into and out of the processing chamber 20. The servo motor can be controlled by the control facility 30, which can include if desired a motion controller. The control facility can also include a data acquisition stage for accumulating selected processing data associated with the thermal processing operation of the illustrated furnace, and a user interface 32 for allowing selected information to be inputted to the system 10 or exchanged between the system and a user. The user interface can be any suitable input device, such as a keyboard, monitor and/or mouse, and touchscreen.

With further reference to FIG. 1, the illustrated wafer processing system 10 includes a feedback subsystem 34 for detecting, measuring and/or determining the temperature of the wafer within the thermal processing system 14, and in particular, within the process chamber 20. The feedback subsystem can employ a pyrometer, and preferably a single pyrometer, for detecting one or more parameters of the wafer W, such as temperature. For example, the pyrometer can detect the amount of light reflected from the wafer, and then generates a signal that is received by the control facility 30. The control facility, based upon this data, can determine the emissivity and then temperature of the wafer W. One example of a suitable feedback subsystem is disclosed and described in copending U.S. patent application Ser. No. 09/280,308, entitled SYSTEM AND METHOD FOR THE REAL TIME DETERMINATION OF THE IN SITU EMISSIVITY OF A WORKPIECE DURING PROCESSING, filed Mar. 29, 1999, the contents of which are herein incorporated by reference. The pyrometer can also be used to directly, non-invasively measure the wafer temperature. The pyrometer can then generate an output signal that can be correlated to the wafer temperature. The pyrometer signal is then coupled to the control facility 30.

The illustrated control facility 30 can be any suitable computing apparatus, such as a computer or data processor, having suitable storage and processing elements. The control facility 30 preferably stores a suitable temperature control program that controls operation of the wafer processing system 10 to heat a wafer according to an intended wafer temperature profile or trajectory. The control program preferably employs the data provided by the feedback subsystem 34 and the intended temperature profile to determine the appropriate speed of the elevator subsystem as well as the position of the wafer within the chamber.

The control facility 30 actuates the elevator subsystem, which in turn moves the wafer in the processing chamber 20 so as to generally achieve, attain, follow or match as closely as possible the intended temperature profile. The elevator subsystem 24 moves the wafer W in the process chamber 20 in a selected manner so as to heat the wafer temperature in a selected manner. The wafer W can be heated according to a desired recipe that comprises among other processing parameters the temperature ramp-up rate, ramp-down rate, and soak time or temperature. As used herein, soak time is intended to include the time or duration of heating of the wafer when resident within the process chamber when the temperature reaches or attains for a period of time a steady state condition. The soak time is generally illustrated in a graph of an actual or intended temperature profile as a relatively horizontal region between the ramp-up and ramp-down times. According to one practice, the soak time generally occurs at wafer temperatures at or about 1050° C.

Figure 2:
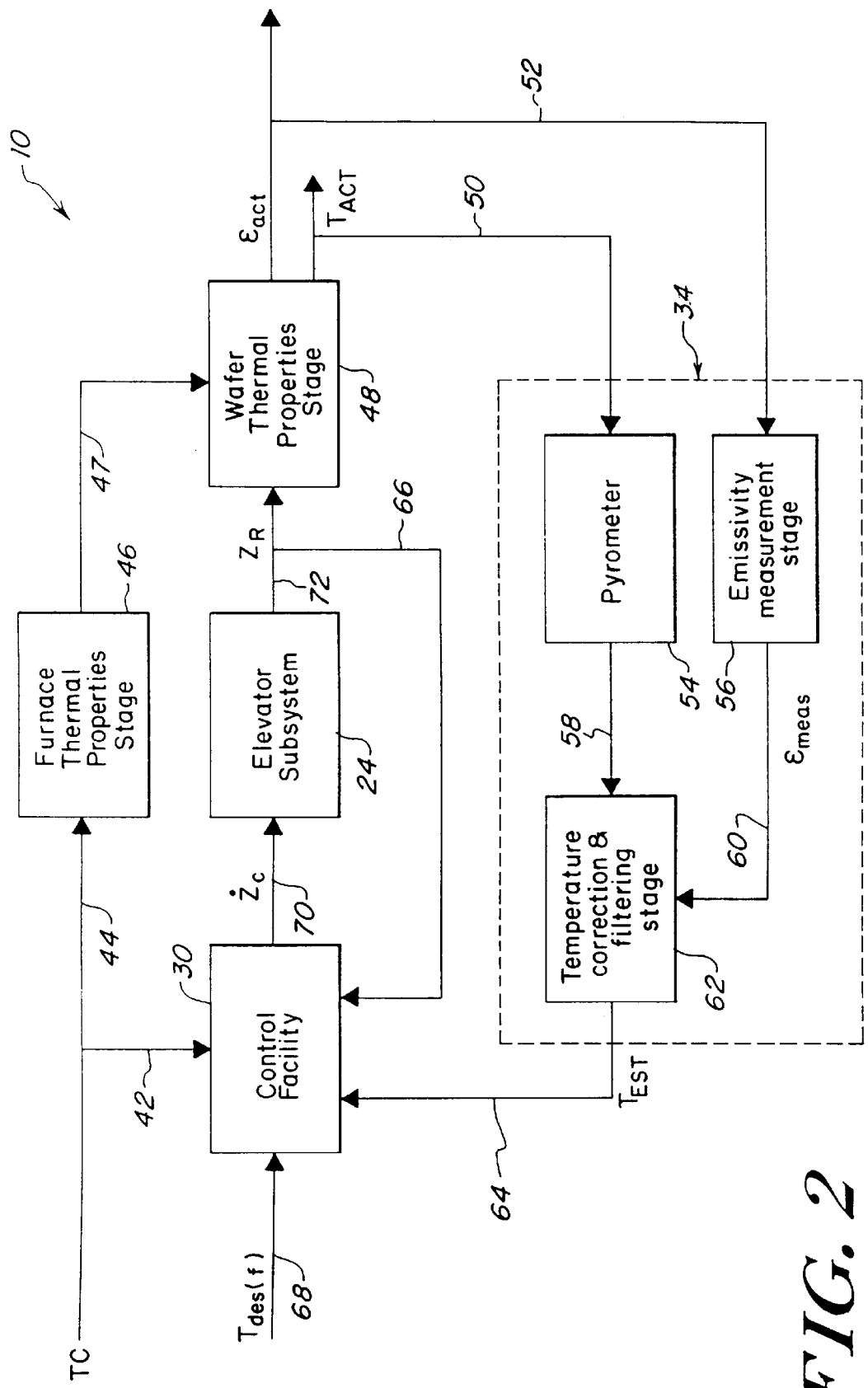
FIG. 2 is a schematic block diagram representing the operational aspects of the wafer processing system of FIG. 1.

FIG. 2 is a schematic block diagram illustrating the integration and operation of the wafer processing system 10 of FIG. 1. The illustrated wafer processing system 10 employs the control facility 30 for receiving and processing selected data signals generated by the system. In particular, the control facility 30 receives a temperature trajectory signal 68 that is generated by a trajectory generator 74, FIG. 3, that forms part of the wafer processing system 10. The trajectory generator 74 generates an intended temperature profile or trajectory, also referred to as a desired temperature, which can also be supplied from the user interface 32. The trajectory generator 74 generates the intended temperature profile based on a user defined wafer processing recipe, which can include certain selected wafer processing parameters, such as ramp-up time, ramp-down time, and soak or hold time/temperature. Those of ordinary skill will readily recognize that other certain selected parameters can also form part of the recipe which is input to the wafer processing system 10 through the user interface 32. The thermocouples 36A–36E measure the temperature profile of the process tube 18.

In the illustrated system 10, the control facility 30 regulates the temperature gradient formed along the process tube 18, and employs the thermocouples to ensure that the proper temperature gradient is attained. The thermocouples generate a signal 42 which is inputted to the control facility 30 for further processing. The signal 44 generally corresponds to the spike settings of the thermocouples. Likewise, the thermocouple signal, designated as signal 44, is input to a furnace thermal properties stage 46. The illustrated furnace thermal properties stage 46 can be a mathematical model that represents the dynamics of the furnace to determine or establish the thermal properties of the thermal processing system 14. Based on the signals generated by the thermocouples, the illustrated wafer processing system 10 can determine whether the desired thermal model is achieved within the process chamber 20. The furnace thermal properties stage generates an output signal 47 representative of the actual raw measurements of the thermocouples. The signal 47 is introduced or input to a wafer thermal properties stage 48. The wafer thermal properties stage 48 can be a predictive or adaptive mathematical stage for modeling how a wafer is heat processed within the process chamber 20. Once the processing system 14 attains a thermal state, the wafer physical properties dictate the thermal response of the wafer. The wafer thermal properties stage 48 for example generates an output temperature signal 50 that represents the actual raw temperature of the wafer during processing. The illustrated wafer thermal properties stage 48 also generates an output emissivity signal 52 that is representative of the actual raw emissivity of the wafer during processing. The output signals 50 and 52 generated by the stage 48 are introduced to the feedback subsystem 34.

The illustrated feedback subsystem 34 is described in further detail below. The feedback subsystem 34 can employ a pyrometer 54 that communicates with (e.g., provides input to) a temperature correction and filtering stage 62. The feedback subsystem 34 can also include an emissivity measurement stage 56 that is disposed in communication with the temperature correction and filtering stage 62. The actual temperature signal 50 generated by the wafer thermal properties stage 48 is sensed by the pyrometer 54, which generates an output signal 58 that can be subsequently correlated to the temperature of the wafer. The output emissivity signal 52 generated by the stage 48 is input to the emissivity measurement stage 56. The emissivity measurement stage processes the signal 52 and generates an output signal 60 representative of the actual measured emissivity of the wafer. The output signals 58 and 60 are introduced to the temperature correction and filtering stage 62 for performing any appropriate emissivity compensation while concomitantly filtering any noise introduced to the raw signals generated by the pyrometer 54 or other system components. Those of ordinary skill will readily recognize that other functions can be performed by the filtering stage 62, such as any appropriate scaling or biasing of the signal as determined appropriate by the system 10. The feedback subsystem 34 generates an output signal 64 that is representative of the filtered measured temperature of the wafer. The filtered temperature signal 64 is introduced to the control facility 30.

The illustrated control facility 30 processes one or more of the thermocouple signal 42, the intended temperature profile signal 68, and the filtered temperature signal 64 to generate an output signal 70 that is introduced to the elevator subsystem 24. The output signal 70 is representative of the appropriate speed $Z_C$ that the elevator tube 26 is moved in the axial direction. The elevator subsystem 24 hence moves at a speed determined by the control facility 30 based on one or more of the foregoing appropriate input parameters. The elevator subsystem 24 moves the elevator to a position $Z_R$ represented by the elevator output signal 72. This signal is disposed in feedback communication via feedback loop 66 with the control facility 30. Hence, the control facility 30 determines the appropriate elevator speed based on the wafer position within the process chamber 20. The elevator output signal 72 is also introduced to the wafer thermal properties stage 48, where it is processed along with the furnace properties represented by output signal 47 to determine the actual raw temperature and emissivity of the wafer during processing. Specifically, the elevator position in the process chamber determines the thermal energy to which the wafer is subjected. This, together with the wafer physical properties, determines the resulting actual wafer temperature and emissivity during processing. Those of ordinary skill will readily recognize that the illustrated stages 46 and 48 are depicted as separate stages for purposes of simplicity and clarity. The stages 46 and 48 can be easily integrated into the control facility 30, and need not be implemented as separate stages. In an alternate embodiment, the stages 46 and 48 can be implemented in appropriate software that is stored in any suitable storage medium disposed within the wafer processing system 10, such as in the control facility 30.

A significant advantage of the present invention is that the control facility 30 processes the filtered temperature signal 64 to determine how to position the wafer within the process tube 18. Specifically, the control facility 30 processes the estimated temperature signal 64 to generate an appropriate elevator speed to determine the wafer speed within the chamber 20 during processing. Another significant advantage of the present invention is that the control facility 30 controls or regulates the position and speed of the wafer within the process chamber 20 based on one or more signal inputs, such as described above. Hence, the control facility 30 need not control operation of other system components that could introduce or affect the processing of the wafer.

Figure 3:
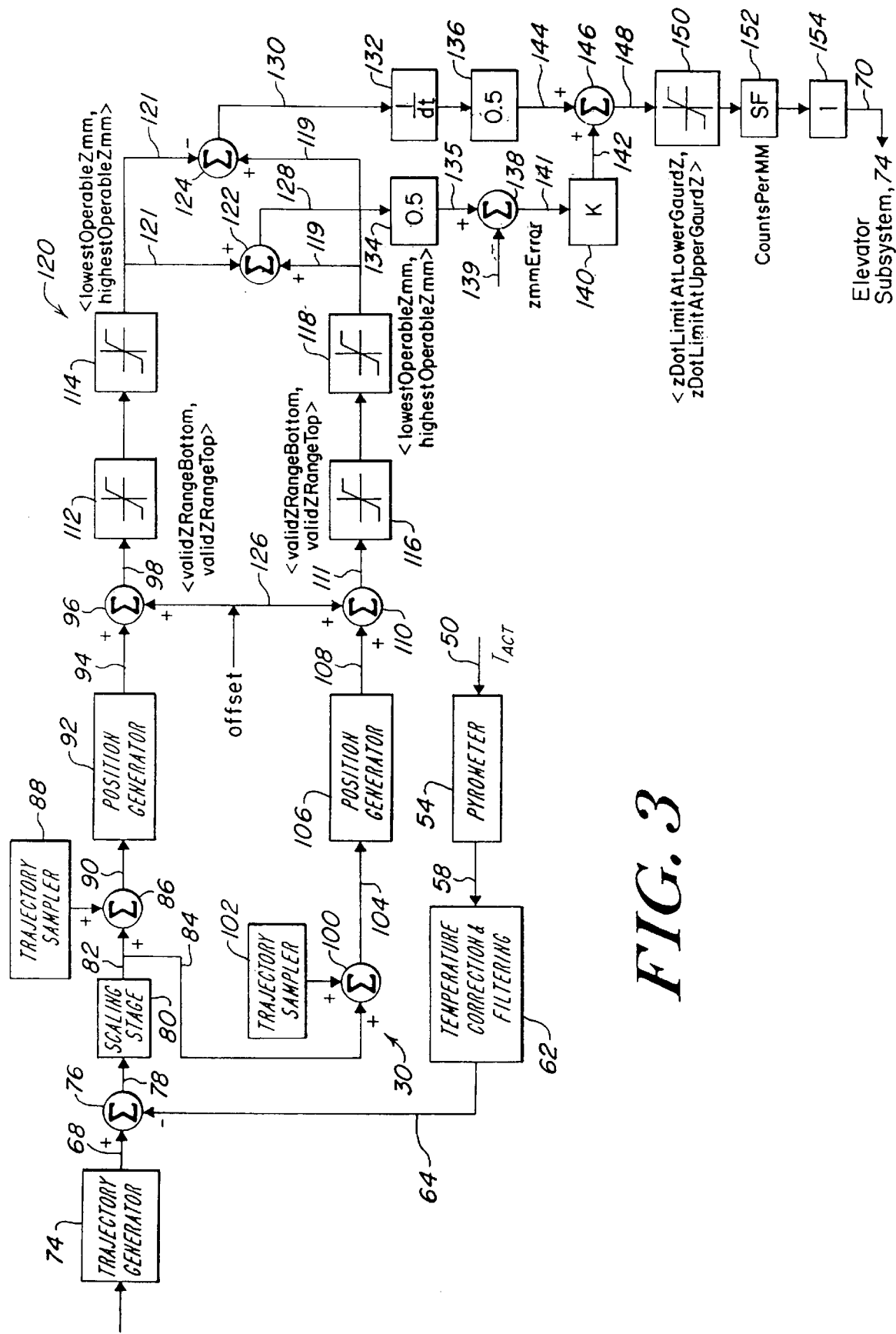
FIG. 3 is a detailed schematic diagram illustrating the signal processing features of the control facility of FIG. 1.

FIG. 3 is a schematic diagram illustrating the operational and functional aspects of the control facility 30 in connection with the feedback subsystem 34 of the present invention. As illustrated, the trajectory generator 74 generates an intended temperature profile that the system attempts to attain when controlling the temperature of the wafer in the process chamber 20. The trajectory generator 74 generates an output signal 68 that is introduced to a summer element 76. Moreover, as set forth above, the actual wafer temperature signal 50 generated by the wafer thermal properties stage 48 is sensed by a pyrometer 54, which in turn generates a pyrometer output signal 58. The output signal 58 is introduced to a temperature correction and filtering stage 62 which compensates for the emissivity or temperature of the wafer, while concomitantly filtering unwanted noise. The filtering stage 62 generates an output signal 64 which is introduced to the summer 76. The output signal 64 is representative of the filtered measured temperature of the wafer within the process chamber 20. The illustrated summer 76 subtracts the value associated with the output signal 64 from the value associated with the signal 68 to generate an error signal 78. The error signal 78 is introduced to a scaling stage 80, which scales the signal 78 by a selected scale factor. The scaling stage 80 attempts to optimize the wafer heating performed by the illustrated wafer processing system 10. The particular recipe desired by the end user impacts the particular scaling factor employed by the scaling stage 80. For example, the recipe can be determined by the end user in accordance with particular processing parameters, such as the ramp rates and the rollover portions of the temperature trajectory. According to one practice, when processing a relatively pure silicon wafer, the scaling stage 80 employs a scale factor of 1.2. Those of ordinary skill will readily recognize that the scaling stage 80 can also provide a menu of choices from which the user can select a particular scale factor according to the particular wafer processing recipe. The scaling stage 80 generates an output signal 82 that is introduced to a summer 86. A trajectory sampler 88 samples the intended temperature profile at a particular time and generates a signal that is also introduced to the summer 86. In response, the summer 86 generates an output signal 90 that corresponds to the sum of the values of the two input signals. Similarly, the scaling stage 80 generates output signal 84 that is introduced to a summer 100. A second trajectory sampler 102 samples the intended temperature profile at a time different than the trajectory sampler 88 and generates an output signal that is introduced to the summer 100. The summer 100 also generates an output signal 104 that corresponds to the sum of the values of the two input signals.

The output signal 90 of summer 86 is introduced to a position generator 92. The position generator 92 analyzes the slope of the intended temperature profile to determine a particular change, and then generates an output signal 94 representative of a particular wafer position. The output signal 94 is introduced to a summer 96. Likewise, the summer output signal 104 is introduced to a position generator 106, which in turn generates an output signal 108 for subsequent introduction to a summer 110. The summers 96 and 110 also receive an offset signal indicative of a particular offset value, and which can be, according to one practice, a constant value. The illustrated summer 96 generates an output signal 98, and the illustrated summer 110 generates an output signal 111, each output signal being representative of the sum of the values of the two input signals. The output signals 98 and 111 are each introduced to a boundary determination stage 120 for determining the upper and lower bounds of values that are acceptable by the control facility 30 of the present invention. For example, the boundary determination subsystems 112 and 116 determine the valid range of wafer positions that can be employed within the process tube in accordance with the present invention. The boundary determination subsystems 114 and 118 determine the allowable range of wafer positions within the process chamber 20. The boundary determination stage 120 generates output signals 119 and 121 which are introduced to summers 122 and 124. The summer 122 adds the output signals to generate a summer output signal 128. The illustrated summer 124 subtracts the value associated with signal 121 from signal 119 to generate summer output signal 130.

The illustrated summer output signal 128 is introduced to a scaling stage 134, which can employ any particular scaling factor. As illustrated, and merely by way of illustration and is not to be interpreted in a limiting sense, the scaling stage 134 employs a scaling factor of 0.5. The illustrated scaling stage 134 scales the summer output signal 128 to attain a signal indicative of a desired vertical position. This signal is introduced to summer 138, which also receives a vertical axis signal 139. The vertical axis signal 139 is subtracted from the output signal 135 to attain an output vertical position signal 141. This output signal 141 is introduced to a gain stage 140 for applying an amplifying gain to the signal 141. The illustrated gain stage 140 generates output signal 142 which is introduced to a summer 146.

The illustrated summer 124 subtracts the value associated with signal 121 from signal 119 to generate an output signal 130. The summer output signal 130 is introduced to a derivative stage 132 for taking the derivative of the value of the output signal 130. The derivative stage generates an output signal which is introduced to a scaling stage 136. The scaling stage 136 can be identical to the scaling stage 134. The illustrated scaling stage 136 generates an output signal 144 which is indicative of the derivative of the desired wafer position. This output signal 144 is also introduced to a summer 146, which combines the signal with the signal 142. The summer 146 generates a summer output signal 148 which is introduced to another boundary determination subsystem 150 for determining the upper and lower wafer velocity limits. As illustrated, the boundary determination stage 120 and the boundary subsystem 150 ensure that the elevator subsystem 124 does not become saturated or receive signals outside of any particular operable range. The boundary determination stage 120 determines particular positions that are within an allowable range, while the boundary determination subsystem 150 determines the upper and lower elevator speeds that are realizable by the present invention. The illustrated boundary determination subsystem 150 generates an output signal that is introduced to a scale factor stage 152. The illustrated scale factor stage 152 determines the distance that the elevator is to move and scales the value of the output signal of stage 150 by a preselected amount. The illustrated scale factor stage 152 also converts the output signal generated by the boundary determination subsystem 150, which is representative of elevator speed, into an output signal compatible with an encoder value, such as counts per second.

The illustrated scale factor stage 152 generates an output signal that is introduced to a counting stage 154. The counting stage 154 determines how many particular counts the elevator subsystem is to move the wafer based on a particular input signal. For example, the counting stage 154 identifies how much the wafer is to be moved within the process chamber to achieve the temperature defined by the intended temperature profile 68. The counting stage 154 generates output signal 70, FIG. 2, that is then introduced to the elevator subsystem 24.

Figure 4:
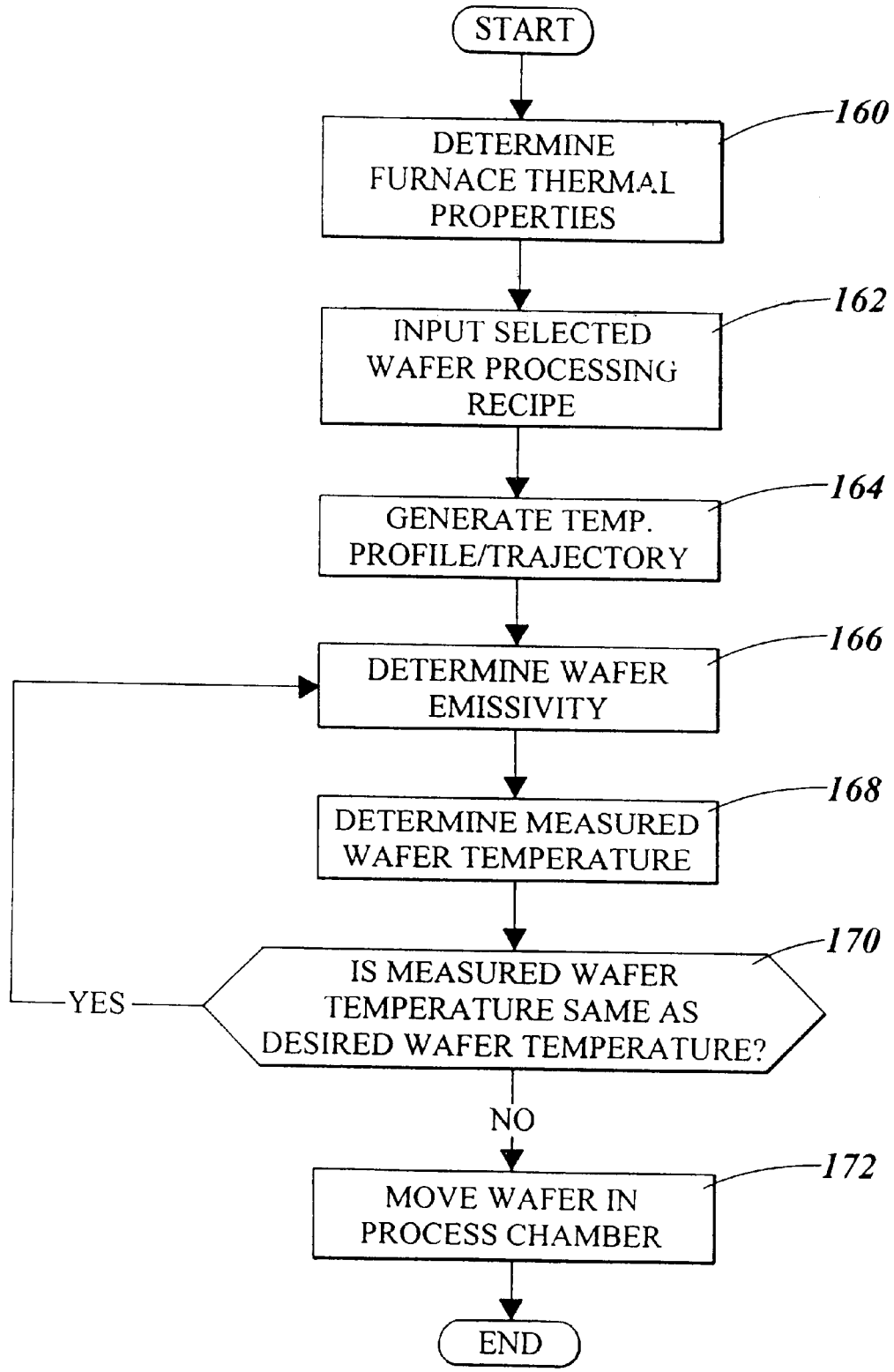
FIG. 4 is a schematic flow chart diagram illustrating the method for heating a wafer to achieve a desired wafer temperature by the system of FIG. 1 in accord with the teachings of the present invention.

In operation, the wafer processing system 10 moves the position of the wafer within the process chamber 20 in response to the measured temperature of the wafer during processing. The wafer is moved in order to achieve a selected temperature profile. With reference to FIG. 4, the system 10 actuates the heating elements 22a–22c disposed about the process tube in order to achieve a selected temperature gradient. The thermocouples 36a–36e are disposed about the process tube 18 in order to measure the temperature at selected locations. The thermocouples produce output signals that are introduced to the control facility 30, and to a furnace thermal properties stage 46 (e.g., the thermal processing system 14) to determine the thermal properties thereof (step 160). The system user then determines a selected wafer processing recipe and inputs the recipe to the system through the user interface 32 (step 162). The trajectory generator 74 generates a selected temperature profile (step 164) that indicates the desired temperature heating scheme for the wafer. The temperature profile includes a selected ramp-up rate, ramp-down rate, and soak temperature or time.

The wafer processing system 10 then determines the raw actual wafer temperature and emissivity, represented by signals 50 and 52, FIG. 2, which are input to the feedback subsystem 34. The feedback subsystem measures the temperature and emissivity of the wafer in the process chamber (step 168) and corrects for any unwanted noise with the filtering stage 62. The feedback subsystem then generates a signal representative of the filtered measured wafer temperature. The wafer temperature signal 64 is then introduced to the control facility 30. If desired, the control facility 30 can also receive the temperature profile and the output signals from the thermocouples. The control facility 30 performs a number of selected system functions. One function is to determine whether the measured temperature is the same or within some selected variation from the desired temperature defined by the temperature profile (step 170). If it is, then the system determines the wafer emissivity and temperature, and again verifies or checks whether the wafer temperature is properly correlated with the desired wafer temperature. If the wafer temperature is different than the desired temperature by more than a selected amount, then the system adjusts the position of the wafer in the process chamber 20 by actuating the elevator subsystem 24 (step 172). As illustrated in FIG. 2, the control facility 30 generates a an elevator speed signal 70 that actuates the elevator to move the wafer at a selected speed to a selected position. The position the wafer is placed corresponds to the position sufficient to heat the wafer to or close to the desired temperature.

The control facility 30 also performs a number of other functions as illustrated in FIG. 3. For example, the control facility determines the amount of error in the system, scales the error by a selected amount, and then determines the desired wafer position. The control facility 30 also determines the acceptable operational bounds or range of the wafer processing system based, at least in part, on the error signal. The control facility 30 also converts the information received thereby into suitable wafer speed and/or position data for moving the wafer within the process chamber to achieve or track the desired temperature profile.

The control program employed by the control facility 30 of the present invention for determining movement of the wafer W within the process chamber 20 is described below.

Initially, it is helpful to first analyze and understand the general two-dimensional heat conduction equations. In cylindrical coordinates, the two-dimensional heat conduction equations for the wafer is given by:

$$\rho C \frac{\partial T}{\partial t} = \frac{\partial}{\partial \tilde{z}}\left(\kappa \frac{\partial T}{\partial \tilde{z}}\right) + \frac{1}{r}\frac{\partial}{\partial r}\left(r\kappa \frac{\partial T}{\partial r}\right) \tag{1}$$

where we have assumed axi-symmetry in the θ-direction, and $\tilde{z}$ represents the local coordinate system of the wafer (i.e. $\tilde{z}=0$ defines the lower surface of the wafer, and $\tilde{z}=h_w$ is at the top surface of the wafer). For silicon, the specific heat and thermal conductivity are given by C=C(T) and κ=κ(T), respectively. The appropriate boundary conditions for Equation (1) are given by $$-\kappa \frac{\partial T}{\partial \tilde{z}}\bigg|_{\tilde{z}=h_w} = \varepsilon_1 \sigma T^4\big|_{\tilde{z}=h_w} - \alpha_1 q_1 \tag{1a}$$

$$-\kappa \frac{\partial T}{\partial \tilde{z}}\bigg|_{\tilde{z}=0} = -\left(\varepsilon_b \sigma T^4\big|_{\tilde{z}=0} - \alpha_b q_b\right)$$

$$-\kappa \frac{\partial T}{\partial r}\bigg|_{r=0} = 0$$

$$-\kappa \frac{\partial T}{\partial r}\bigg|_{r=R_w} = \varepsilon_e \sigma T^4\big|_{r=R_w} - \alpha_e q_e$$

where ε and α are the emmisivity and absorptivity of the wafer, and the subscripts t, b, and e are used to denote the top surface, bottom surface, and the edge of the wafer, respectively. The various heat source terms are defined as follows:

$$q_1 = \epsilon_{bj}\sigma F_{w-1}(r,z)T_1^4 + \epsilon_{bj}\sigma \int_z^{H_{of}} dF_{w-d(side)}(r,z',z)T_s^4(z') \tag{2a}$$

$$q_b = \epsilon_{bj}\sigma F_{w-b}(r,z)T_b^4 + \epsilon_{bj}\sigma \int_0^z dF_{w-d(side)}(r,z',z)T_s^4(z') \tag{2b}$$

$$q_e = \epsilon_{bj}\sigma \int_0^{H_{bj}} dF_{w(edge)-d(side)}(r,z^1,z)T_s^4(z') \tag{2c}$$

Here, $F_{w-t}(r, z)$ represents the view factor between the wafer, at a given radial location (r) and height (z), to the top of the bell jar which is at temperature $T_t$. Similarly, $F_{w-r}(r, z)$ represents the view factor to the bottom of the chamber, and d $F_{w-d(side)}(r, z', z)$, is the view factor to a ring at height $z'$ on the side wall of the bell jar ($T_s(z)$ denotes the bell jar temperature along the z-direction, and $H_{bj}$ is the height of the chamber). Observe that the integrals in Equations (2) and over $z'$. Furthermore, the boundary condition at the edge [Equation (2c)] is determined by the view factor from the edge of the wafer to the bell jar. Again, note that the variable z is used to denote the wafer position as measured from the bottom of the chamber.

The boundary conditions given by Equation (1a) and the heat source terms given by Equations (2a–2c) are typical in a system where a body of fixed temperature (the bell jar) is heating a smaller object (the wafer in this case) by radiation. Furthermore, Equation (1) is as set forth above until we consider the following:

a) The wafer temperature during processing covers a very large temperature range, (e.g. between about 30 and about 1100° C.), over which the non-linear boundary conditions vary substantially.

b) The wafer thickness to diameter ratio is very small, making the implementation of numerical techniques such as finite element or finite difference very "stiff" in nature.

c) The temperature variations across the wafer thickness and along its radius are of the order of about 1° C. At typical processing temperature of 1000° C., this corresponds to about 0.1%. Thus, to resolve the details of the temperature distribution, the numerical scheme has to be accurate to about 0.01% or less. This requires prohibitive number of mesh points to be analyzed.

As a result, the brute force method of directly solving Equation (1) does not work if simply implemented by the control facility 30 of the system 10. Hence, according to one practice, the control facility can employ perturbation techniques, as discussed below.

Perturbation Analysis

To proceed, we take advantage of the small thickness ($h_w$) to diameter ($2R_w$) ratio of the wafer. Specifically, we introduce the following perturbation expansion for the temperature variable:

$$T(r,\tilde{z},t) = T_o(r,t) + T_2(r,\tilde{z},t) \quad (3)$$

where $T_2/T_o \sim \delta 2 \ll 1$, and $\delta = h_w/R_w$. Here, $\delta$ is the usual perturbation parameter. The leading order perturbation equation now becomes:

$$\rho C(T)\frac{\partial T}{\partial r} = \frac{\partial}{\partial \tilde{z}}\left(\kappa(T)\frac{\partial T_2}{\partial \tilde{z}}\right) + \frac{1}{r}\frac{\partial}{\partial r}\left(r\kappa(T)\frac{\partial T}{\partial r}\right) \quad (4)$$

Note that, for ease of notation we have dropped the 0-subscript on temperature (i.e. $T = T_o(r,t)$).

Equation (4) is now integrated across the wafer thickness in order to obtain the desired one dimensional radial equation:

$$h_w \rho C(T)\frac{\partial T}{\partial t} = \quad (5)$$
$$-(\varepsilon_1 + \varepsilon_b)\sigma T^4 + \alpha_1 q_1(r,z) + \alpha_b q_b(r,z) + \frac{h_w}{r}\frac{\partial}{\partial r}\left(r\kappa(T)\frac{\partial T}{\partial r}\right)$$

Where we have used some of the boundary conditions given by Equation (1a), Equation (5) is the 1-D heat conduction equation for the wafer.

Next, by resorting back to Equation (4) we can solve for $T_2$, and furthermore obtain the temperature difference across the thickness of the wafer $[\Delta T \equiv T_2|_{\tilde{z}=h_w} - T_2|_{\tilde{z}=0}]$. This temperature difference is important in thermal stress and warping calculations, and is given by:

$$\Delta T + \frac{h_w}{2\kappa}[(\varepsilon_b - \varepsilon_1)\sigma T^4 + \alpha_1 q_1 - \alpha_b q_b] \quad (6)$$

We next show below that the value of T that can be used in Equation (6) is that of the wafer average (in radius) temperature.

The 0-D Equation for Wafer Temperature

In order to further simplify Equation (5), again we take advantage of the inherent thermal uniformity in the system. The following expansion is used for the wafer temperature:

$$T(r,t) = \overline{T}(t) + T_1(r,t) \quad (7)$$

with $$\overline{T}(t) \equiv \frac{2}{R_w^2}\int_0^{R_w} T(r,t) r\, dr \quad (7a)$$

and $T_1$ representing the temperature variation in the radial direction ($T_1/\overline{T} \ll 1$). Using this expansion in Equation (5) followed by an integration over the wafer radius results in the desired 0-D equation for the average temperature:

$$h_w \rho C \frac{d\overline{T}}{dt} = -(\varepsilon_1 + \varepsilon_b)\sigma \overline{T}^4 + \alpha_1 \overline{q}_1(z) + \alpha_b \overline{q}_b(z) \quad (8)$$

where the over-bars on the heat source terms indicate averaging over radius, that is, $$\overline{q} = \frac{2}{R_w^2}\int_0^{R_w} q(r,t) r\, dr \quad (9)$$

Equation (8) merely states that the rate of temperature change for the wafer is governed by the heat input from the top and bottom surfaces, as well as the radiant thermal properties of the wafer.

The 1-D Radial Equation

The first order (perturbed) equation governing $T_1$ can be obtained after some algebraic manipulations. The result is a linear heat conduction equation that governs $T_1$. That is, it describes the radial dependence of the wafer temperature during processing. There are three heat transfer mechanisms that determine the rate of change for $T_1$:

a) Regions of high temperature loose heat more rapidly as the wafer tends to equilibrate with its surrounding.

b) Non-uniform view factors from the bell jar to the wafer can cause temperature non-uniformity on the wafer.

c) Any edge heating (or cooling) of the wafer, as given by the boundary condition will propagate inward through conduction.

It is important to emphasize that the resulting equation for $T_1$ is linear with some of the coefficients being functions of $\overline{T}$, where $\overline{T}$ is calculated independently and a priori by solving Equation (8). That is, we have reduced the problem of solving the 2-D heat conduction equation for the wafer into solving a 0-D equation for $\overline{T}$, a linear heat conduction equation for $T_1$, a linear heat conduction equation for $T_1$, and an analytic relation for $\Delta T$.

Without this procedure, computationally obtaining the solution of the general Equation (1) is extremely difficult, since as we describe below, the radial temperature variations are sub 0.1% in nature. Available numerical techniques, or existing radiation heat transfer software, are not robust enough to readily produce results with such accuracy. We do not encounter any such problems in solving the equation for $T_1$, since the primary variable there is the perturbed temperature and not the total wafer temperature. That is, a 0.1% numerical inaccuracy in the solution of the equation for $T_1$ results in an equivalent level of uncertainty in $T_1(r,t)$. However, a 0.1% inaccuracy in solving Equation (1) results in a 100% uncertainty in the value of $T_1(r,t)$. To solve the radial temperature distribution, to within 0.1%, the solution of Equation (1) has to be accurate to within 0.001%.

Figure 5:
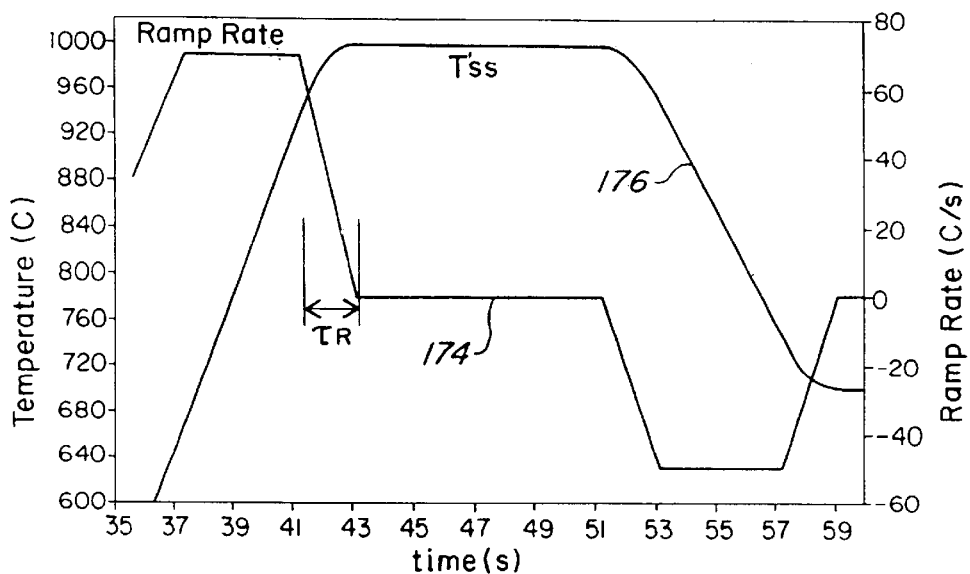
FIG. 5 is a graphically representation of a ramp rate and corresponding temperature profile employed by the wafer processing system of the present invention.

With reference to FIGS. 1–3, to begin processing, the wafer is placed on a quartz wafer holder 38 which sits on a quartz elevator tube 28. The wafer temperature is then changed by moving the wafer up or down in the process chamber 20. That is, wafer temperature trajectory is governed by the position trajectory in the belljar, as well as by its radiative properties. Wafer temperatures up to 1200° C. and ramp rates of up to 220° C./sec can be achieved in the wafer processing system 10. During processing, the temperature at the center of the wafer is measured using an emissivity compensated pyrometry system. The measured wafer temperature is then used in conjunction with a control algorithm stored in the control facility 30 to determine the elevator position that is required to produce the desired temperature trajectory. As shown in FIG. 5, the temperature trajectory or profile generated by the trajectory generator 74 according to a selected recipe can be as follows: a) start the closed loop control at a user specified temperature, b) ramp the temperature at a fixed rate (user specified), c) hold steady at a specified soak temperature for a period of time, and d) ramp down at a given rate until wafer is unloaded. Each portion of the temperature trajectory as defined above is defined according to the input recipe, and has a waveform that is similar to that shown in FIG. 5. For example, the ramp rate graph 174 can be defined as a series of discrete ramp rates, and the temperature trajectory 176 is has a start rate, soak temperature, and then ramp down rate. The trajectory 174 is the derivative of the ramp rate graph 176.

The generic requirements of the control facility 30 of the present invention can be as follows:

a) Trajectory tracking during temperature ramp-up can be if desired within approximately 5% of the specified rate. Other percentages can also be used.
 b) The temperature over/undershoot remains below 1.5° C. (for a 1000° C. soak time or temperature this corresponds to 0.15%). Other values can also be employed.
 c) The temperature error rapidly approaches zero as steady state is reached.
 d) The control facility 30 is robust against variations in wafer radiative properties.

The wafer processing system 10 is robust against motion saturation of the elevator at the top of process tube 18. In certain cases the requested ramp rate may be excessive, and hence the wafer can be placed at the maximum allowable travel height. In such cases, as the soak (steady state) temperature is reached the elevator rapidly moves from the saturation position. Using large gains in the system to correct for this can result in unwanted temperature over and undershoots.

Before processing, the wafer, a detailed general model of the wafer temperature is set forth. The processing model consists of a single non-linear ordinary differential equation (ODE) for the wafer temperature. The main underlying assumptions in deriving the model are as follows:

a) The presence of the wafer does not affect the temperature distribution of the process tube 18. This assumption allows us to separate the dynamics of the wafer and that of the thermal processing furnace. Thus, for a given furnace set point, the process tube temperature is first measured using the thermocouples 36A–36E, and is then treated as a known heat source to the wafer. This is well justified since the thermal mass of the process tube is orders of magnitude larger than that of the wafer. Furthermore, slow temperature drifts on the process tube are compensated for through a closed loop temperature control system that is triggered by the three top thermocouples 36C–36E.
 b) To a good approximation, multiple reflections can be ignored in determining the wafer temperature. This is justified since the process tube is made of silicon-carbide which has a low reflectivity of about 0.05.

In general, the above simplifications create a model which is relatively simple and contains all of the relevant physics, and is therefore used in developing the control algorithm implemented by the control facility.

The general heat conduction equation of Equation (1) assumes axi-symmetry in the $\theta$-direction, where $\tilde{z}$ represents the local coordinate system of the wafer (i.e. $\tilde{z}=0$ defines the lower surface of the wafer, and $\tilde{z}=h_w$ is at the top surface of the wafer). For silicon, the specific heat and thermal conductivity are given by $C=C(T)$ and $\kappa=\kappa(T)$, respectively. The appropriate boundary conditions for Equation (1) are set forth in Equation (1a).

As described above, it is shown how the general two dimensional heat conduction equation for the wafer can be integrated (averaged) over its volume to obtain an equation for the average wafer temperature. Since the wafer temperature in the wafer processing system 10 is highly uniform across the thickness and in the radial direction, the average and center temperatures are nearly the same. We can thus devise a single equation for the wafer temperature:

$$h\rho C(T)\frac{dT}{dt} = -(\varepsilon_t + \varepsilon_b)\sigma T^4 + \alpha_t q_t(z) + \alpha_b q_b(z) \tag{10}$$

where T is the wafer average temperature, h is the wafer thickness, $\rho$ is it's density, and C(T) is the specific heat. Also, $\epsilon$ denotes total emissivity and $\alpha$ stands for absorptivity. Furthermore, the subscripts t and b denote the top and bottom surfaces of the wafer, respectively. In general, emissivity and absorptivity are strong functions of temperature up to approximately 600° C., above which they remain approximately constant (this depends on the coating that resides on the wafer surface). The heat source terms are given by:

$$q_t(z) = \epsilon_{bj}\sigma F_{w-t}(z)T_t^4 + \epsilon_{bj}\sigma \int_z^{H_{bj}} dF_{w-d(side)}(z',z)T_s^4(z') \tag{11}$$

$$q_b(z) = \epsilon_{bj}\sigma F_{w-b}(z)T_b^4 + \epsilon_{bj}\sigma \int_0^z dF_{w-d(side)}(z',z)T_s^4(z') \tag{12}$$

Here $F_{w-t}(z)$ represents the view factor between the wafer, at a given height (z), to the top of the belljar which is at temperature $T_t$. Similarly, $F_{w-b}(z)$ represents the view factor to the bottom of the chamber which is at $T_b$, $dF_{w-d(side)}(z',z)$ is the view factor to a ring at height z' on the side wall of the belljar, $T_s(z)$ denotes the belljar temperature along the z-direction, $H_{bj}$ is the height of the chamber, and $\epsilon_{bj}$ is about 0.95 is the belljar emissivity. Observe that the integrals in Equations (2a and 2b) are over z', and the control variable z denotes wafer position as measured from the bottom of the chamber.

Figure 6:
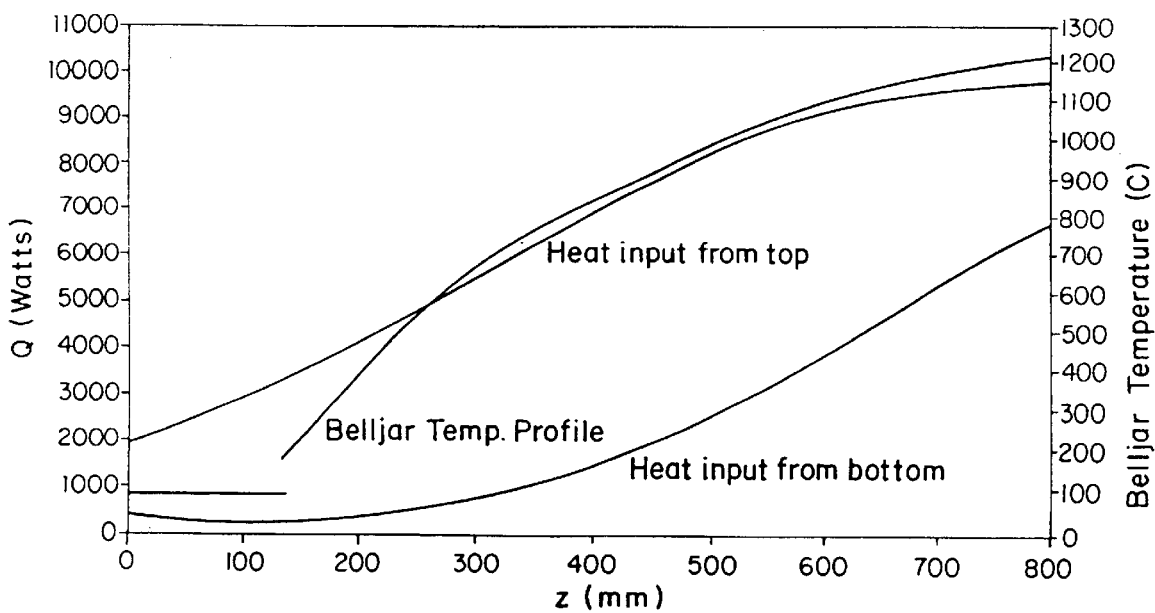
FIG. 6 is a graphical representation of the temperature profile of the process tube 18 of the system 10 of FIG. 1.

In FIG. 6 we illustrate one example of a temperature profile along the belljar [$T_s(z)$], together with the quantities $Q_t=A_w q_t$ and $Q_b=A_w q_b$. The unit watts is shown in the figure and is attained by multiplying both sides of Equations (2a and 2b) by the surface area of the wafer $A_w$. The belljar temperature $T_s(z)$ is constructed by fitting a smooth curve to the data obtained from the thermocouples 36A–36E of FIG. 1. Below the process tube 18 is a water cooled stainless steel ring that remains at approximately 100° C. Observe the temperature discontinuity at the belljar/cooling-ring interface.

Figure 7:
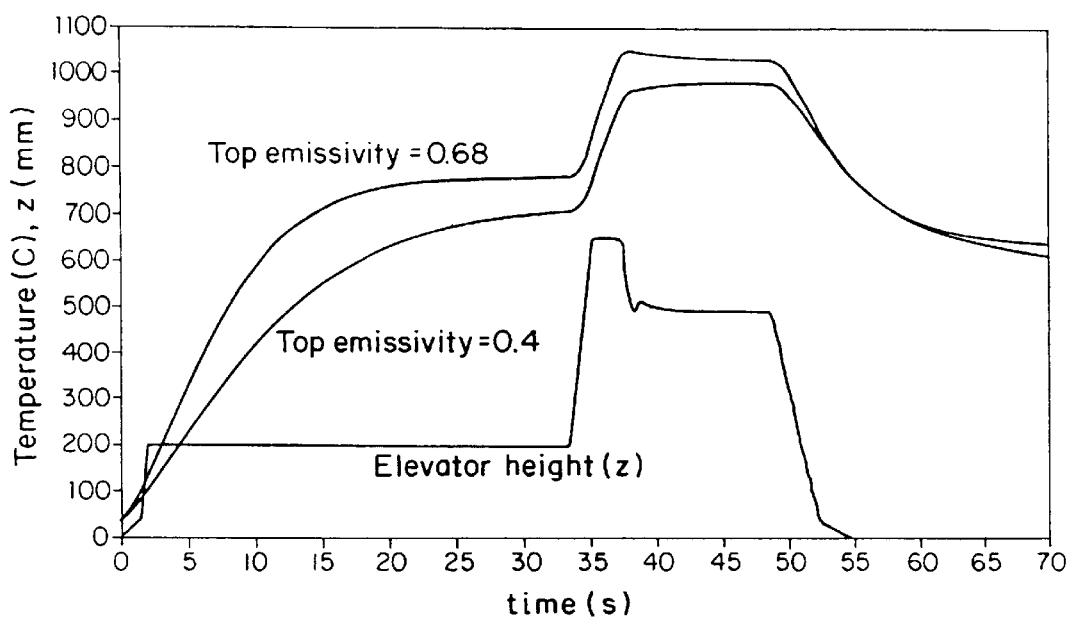
FIG. 7 is a graphical representation of the temperature profile of different wafer types and emissivities.

Equation (10) sets forth in a similar manner that the rate of temperature change for the wafer is governed by the heat input through the top and bottom surfaces, as well as the heat loss by radiation. Both heat transfer terms are governed by the radiative properties of the wafer (top and bottom surface emissivity and absorptivity) which vary substantially depending on the type of the film that has been deposited on the wafer. Typically, the emissivity (and absorptivity) of the wafer surface can vary from 0.2 to 0.9. This is a substantial variation. To further quantify how these variations can cause uncertainties in the accuracy of the temperature control algorithm of the invention we consider two types of wafers with different top surface emissivities. Specifically, we define the type 1 wafer with $\epsilon_1=0.4$, $\epsilon_b=0.068$, and type 2 wafer as pure silicon with $\epsilon_t$32 $\epsilon_b=0.68$. Note that in both cases we assume $\epsilon=\alpha$ which in general is a well justified approximation, since the wafer in the wafer processing system 10 is in near thermal equilibrium with the surroundings. Furthermore, for simplicity, we neglect the temperature dependence of the emissivity. This assumption is a good approximation to make when employing temperatures above 600° C., which is the temperature range of interest. FIG. 7 illustrates the wafer temperature as a function of time for both types of wafers. As illustrated, a typical open loop recipe is used for the wafer position trajectory in the belljar. The furnace set point can be the same as what is presented in FIG. 6.) Of interest is the difference in the rate of change, as well as the steady state temperature value ($T_{ss}$), of the wafer temperature. These results clearly emphasize the importance of developing the control algorithm employed by the control facility 30 to be robust to this type of variation in the wafer surface properties.

Referring again to Equation (1), there are three factors that can introduce limitations on a requested value of z, including physical limits on the travel distance in the vertical direction, acceleration limit on the motor that drives the wafer assembly, and maximum motor velocity limit. That is, the control variable must satisfy the following differential equation and the accompanying inequalities:

$$\frac{d^2 z}{dt^2} = a; \quad |a| < a_{max}; \quad \left|\frac{dz}{dt}\right| < v_{max}; \quad z_{min} < z < z_{max} \tag{13}$$

In the wafer processing system 10, $a_{max}$, is the maximum allowable acceleration, can be about 1000 mm/s² and $v_{max}$ at about 400 mm/s is the maximum limit on the elevator speed. The quantities $z_{min}$ and $z_{max}$ denote the lower and upper travel limits of the elevator, respectively. In the event that any of the above inequalities is present (e.g. $a=a_{max}$ or $z=a_{max}$) the elevator subsystem 24 can be placed in a saturated mode, and therefore may no longer be under system control. During normal operation, the motor velocity limitation is never reached. The acceleration limit, however, can easily be exceeded if certain "smoothness" criteria for the temperature trajectory are not met. As we discuss below, an important function of the control facility 30 is to assure that the requested temperature trajectory does not saturate the elevator. Hence, the temperature trajectory has to be sufficiently smooth. Also, in order to avoid the situation in which $z=z_{max}$, a furnace set point, such as the belljar temperature profile, has to be sufficiently high. That is, the heating power delivered to the wafer has to be large enough in the region $z<z_{max}$ to achieve the requested ramp rate.

The control algorithm implemented by the control facility 30 of the present invention is further described below. One parameter input to the control facility is the temperature trajectory or profile generated by the trajectory generator 74. Since the wafer position signal is fed back to the control facility, we apply standard feedback linearization techniques to obtain sufficient trajectory tracking of the wafer temperature. Consider the situation in which $\epsilon=\alpha$ and also assume $\epsilon_t=\epsilon_b$ (this corresponds to a silicon wafer with no coating on it's surfaces). For this case, we define $q=0.5\ (q_t+q_b)$, and $\epsilon\equiv\epsilon_t=\epsilon_b$. Next, the control term $q(z)$ in Equation (1) can be expressed as follows:

$$2\varepsilon q(z) = 2\varepsilon\sigma T_t^4 + h\rho C\left(\dot{T}_t + \frac{T_t - T}{\tau_{cc}}\right) \tag{14a}$$

or written in a more formal mathematical term:

$$z = f\left(\dot{T}_t + \frac{T_t - T}{\tau_{cc}}, T_t\right) \tag{14b}$$

where $T_t(t)$ is the specified temperature trajectory, and $\tau_{cc}$ is the closed loop time constant (gain) that is adjusted to obtain the desired tracking performance. This formulation forces the wafer temperature to track the trajectory through the following relation:

$$\dot{\tilde{T}} = -\frac{\tilde{T}}{\tau_{cc}} - \frac{1}{\tau_T}\left(\frac{T_t^4 - T^4}{T_t^3}\right) \tag{15}$$

where $\tilde{T}\equiv T_t-T$, and $\tau_T\equiv h\rho C/(2\epsilon\sigma T_t^3)$ is the radiation thermal time constant for the wafer. Expanding T (about $T_t$) in the last term on the right had side of Equation (15), we find:

$$\dot{\tilde{T}} = -\frac{\tilde{T}}{\tau} \tag{16}$$

where $$\frac{1}{\tau} = \frac{1}{\tau_{cc}} + \frac{1}{\tau_T} \tag{17}$$

Figure 8A:
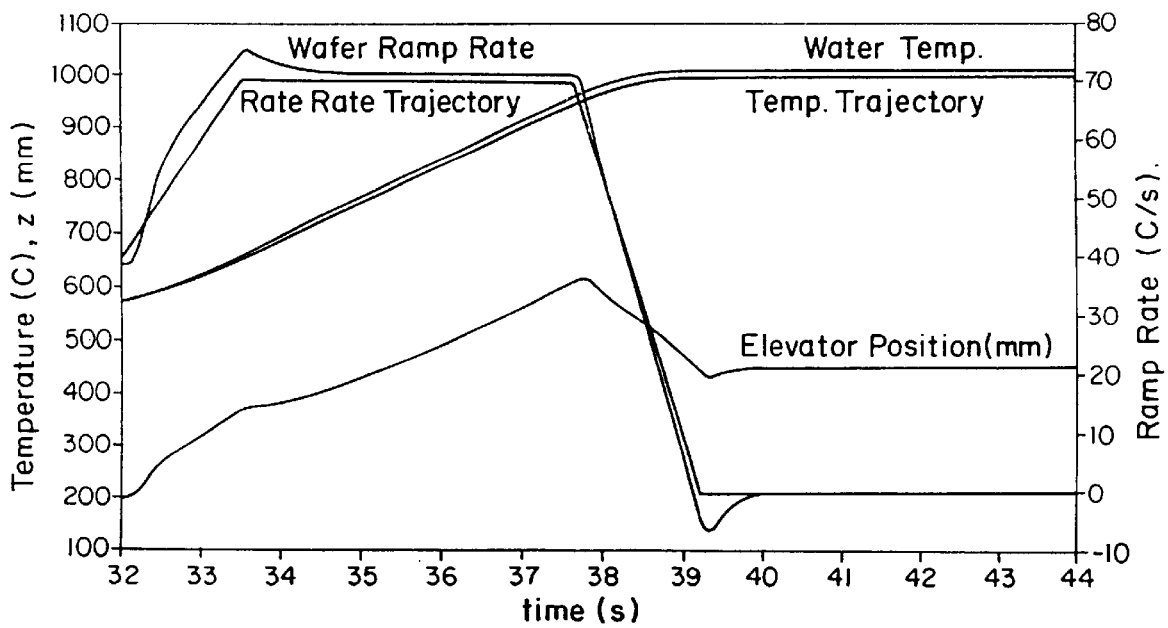
FIG. 8A is a graphical representation of the use of the feedback linearization Equation 14B when tracking a desired trajectory employing a gain of 2.
Figure 8B:
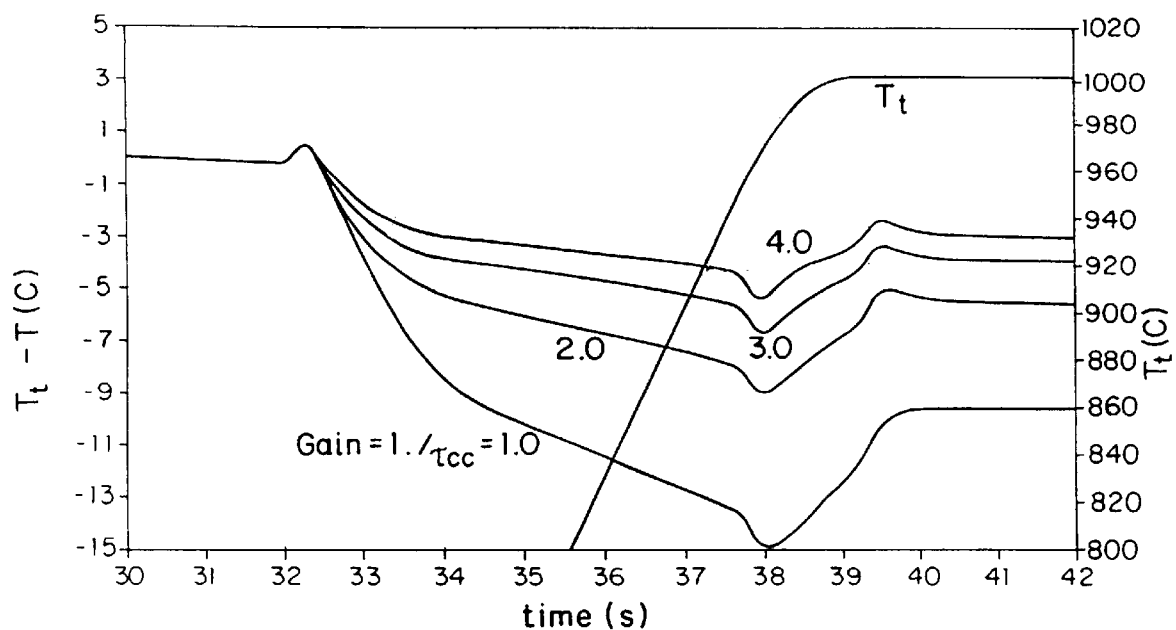
FIG. 8B is a graphical representation of the tracking errors according to gain.

Thus, for an exact model, T(t) approaches $T_t(t)$ exponentially with a time constant of τ. Note, however, that when model inaccuracies are present the use of Equation (14b) to drive the elevator subsystem 24 may be affected by steady state errors. In FIG. 8A, we present a graph of a typical $T_t(t)$, the required control variable z as obtained from Equation (14b), and the resulting T(t). At approximately 580° C., closed loop control begins with a requested ramp rate of 70° C./s and $T_{ss}=1000°$ C. In this example, an error of 10% is introduced in the belljar thermal profile in the solution of Equation (14b). The gain used here is 2 (e.g., $\tau_{cc}=0.5$ s). As illustrated, the trajectory of FIG. 8A includes a steady state error. Moreover, the system 10 exhibits good tracking of the ramp rate in accord with system requirements. In FIG. 8B, the tracking error for various values of the gain is illustrated.

In principle, as $\tau_{cc} \to 0$, all transient and steady state errors will vanish. However, the smallest practical value of $\tau_{cc}$ that can be used in this system is ~0.3 s. The reason for this is the limited sampling frequency and the magnitude of the noise that is part of the current temperature measurement system.

In order to further understand the correlation between the steady state error and $\tau_{cc}$, consider simplifying the function q(z) such that $q(z)=q_o z/H$ (i.e. linear z-dependence for the heat flux). Here, H is the full travel length of the elevator and $q_o$ is a constant representing the particular furnace settings. Furthermore, we assume that the wafer under consideration is silicon with known properties. Hence, the only error introduced by using Equations (14a and 14b) are in the heat flux. That is, when using Equation (10) to solve for T(t) we use $q(z)=q_o z/H$, while in solving for z from Equation (14b) we assume an error in the heat flux due to model and measurement uncertainties, such that $q(z)=\tilde{q}_0 z/H$ ($\tilde{q}_0$ is the model approximation to $q_o$). In steady state, from Equation (10) we find:

$$\sigma T^4 = q_o z/H \tag{18}$$

From Equation (14b), on the other hand, we find:

$$\tilde{q}_o z/H = \sigma T_{ss}^4 + \left(\frac{h\rho C}{2\varepsilon\tau_{cc}}\right)(T_{ss} - T) \tag{19}$$

where $T_{ss}$ is the steady state (soak) temperature (see FIG. 5). By eliminating z from the above equations we find:

$$\left(\frac{\tilde{q}_o}{q_o}\right)T^4 - T_{ss}^4 = \frac{h\rho C}{2\varepsilon\sigma\tau_{cc}}(T_{ss} - T) \tag{20}$$

In the common case where T is nearly equal to $T_t$, we have:

$$\frac{T_{ss} - T}{T_{ss}} = \frac{1 - (\tilde{q}_o/q_o)}{4(\tilde{q}_o/q_o) + (h\rho C/2\varepsilon\sigma T_{ss}^3 \tau_{cc})} \tag{21}$$

This is the desired result that shows how the steady state temperature deviates from that of the trajectory as a function of any error in the model ($\tilde{q}_o/q_o$) and $\tau_{cc}$. Observe that in the limit where $\tau_{cc} \to 0$, the error vanishes. In the more practical limit where $\tau_{cc}$ is about 1 s, and $\tilde{q}_0/q_0$ is about 1.1, we find that $T_{ss}-T$ is about $-8.6°$ C. for $T_{ss}=1000°$ C. In this example, typical silicon properties of $\sigma=2200$ kg/m³, h=0.75 mm, C=1000 J/kg-K and $\epsilon=0.68$ are used. In general, Equation (21) is in good agreement with the graphs shown in FIG. 8B.

Further, the trajectory illustrated in FIGS. 5 and 8A is "rounded" as the soak temperature is reached. As discussed above, this is done to avoid the saturation problem with the elevator acceleration (i.e. the smoothness requirement for the trajectory has to be satisfied). The following analysis quantifies the trajectory smoothness requirements that is needed to avoid this type of saturation. Specifically, consider the following temperature trajectory function after the rollover is initiated:

$$T_t(t)=T_{ss}-(\tfrac{1}{4})R\tau_R \exp(-4t/\tau_R) \tag{22}$$

Note that time has been shifted such that at t=0, rollover begins. Also, Equation (22) smoothly connects to the linear temperature ramp function (with a ramp rate of R) for t<0. The goal of the control facility 30 is to track this function. If one assumes that the control algorithm is accomplishing this task, the system determines at what point the motor acceleration limit is reached. That is, the system determines the smallest value of $\tau_R$ that allows the system to meet the criteria $\ddot{z}<a_{max}$. The system attains this by differentiating Equation (14a) twice with respect to time to obtain:

$$\varepsilon\frac{\partial q}{\partial z}\ddot{z} + \varepsilon\frac{\partial^2 q}{\partial z^2}\dot{z}^2 = 24\varepsilon\sigma T_t^2 \dot{T}_t^2 + 8\varepsilon\sigma T_t^3 \ddot{T}_t + h\rho C \dddot{T}_t \tag{23}$$

In this equation, T has been replaced with $T_t$, in accord with the assumption that the control algorithm is achieving sufficient tracking. Also, observe that for typical applications and the particular trajectory under consideration, the second term on the left hand side and the last term on the right hand side of Equation (19) are the dominant quantities. By keeping only the dominant terms, using Equation (22), and replacing $\ddot{z}$ by the maximum allowable motor acceleration $a_{max}$, we now solve for the limiting value of $\tau_R$ as a function of $a_{max}$ to obtain the following closed relation:

$$\tau_R = 4\left[\frac{h\rho CR}{\varepsilon(\partial q/\partial z)a_{max}}\right]^{1/2} \tag{24}$$

This algebraic manipulation eliminates time from this relation by maximizing $\tau_R$ with respect to time. For a rollover time less than what is predicted by the above equation, the elevator subsystem 24 falls into an acceleration-limited saturation mode. Equation (24) also states that in the case of an infinitely powerful elevator motor ($1/a_{max} \to 0$), or a wafer with almost zero thermal mass, the rollover time can be zero. Furthermore, observe how increasing the vertical thermal gradients on the belljar ($\partial q/\partial z$) reduces the limiting value of $\tau_R$ for applications where R is about 70° C./s, $\partial q/\partial z$ is about $2\times10^6$ W/m³, and $a_{max}$ is set to 1 m/s². Using these values together with the appropriate physical properties for silicon we find $\tau_R$ is about 1.2 s. This value agrees well with both simulations and experimental data. That is, for $a_{max}$ set to a value below 1 m/s² we observe overshoot in wafer temperature, when the requested value of the rollover time is 1.2 s. According to one practice, the system 10 employs the value of $\tau_R=1.5$ s. Equation (24) is an important correlation that is now used to upgrade the elevator subsystem 24 in order to substantially reduce $\tau_R$ for "spike-anneal" applications where minimizing the rollover time is essential.

Figure 9:
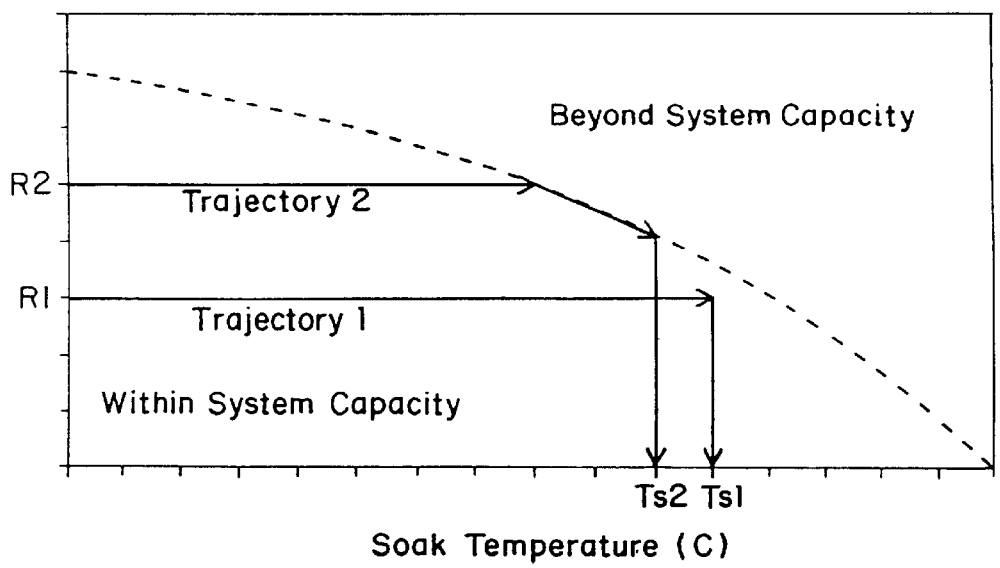
FIG. 9 is a schematic representation of the control domain of the wafer processing system of the invention when operating in a saturated and an unsaturated mode.

Further, in the present wafer processing system 10, large gains (small $\tau_{cc}$) can cause undesired overshoots in cases where the maximum elevator travel height has been reached. In FIG. 9 is a schematic graphical illustration of ramp rate versus soak temperature in the system 10 of the present invention. The dotted line in the graph separates two possible and different operating regimes of the system. In situations where the requested trajectory lies entirely to the left of the dashed curve, such as illustrated by trajectory 1, the system 10 is under full control. However, in cases where the requested ramp rate is too high for the system (e.g. trajectory 2), at a certain point in time the elevator travels to a maximum z-position and is held there until the soak temperature is nearly reached. During this period the system 10 is no longer under control and ramp rates may not track that of the trajectory. For this type of scenario, as the elevator comes out of saturation, overshoots result if the gain is high. Using even moderately large gains ($\tau_{cc}<0.3$) is prohibitive in such cases. Those of ordinary skill will recognize that lowering the ramp rate is not an attractive option, since for a given furnace set point and when running a number of different wafer types, the system may not know a priori which wafers follow trajectory 1 as opposed to trajectory 2 (depending on the coating that exists on the wafer surface). As described below, the best approach to such cases is the use of low gains, together with the addition of the proposed adaptation technique to the control algorithm of the control facility 30.

The control algorithm employed by the control facility 30 can be used in conjunction with the scheme presented above in order to obtain a more robust control system. Specifically, recall that unless the value of $\tau_{cc}$ is very large (prohibitively large due to the noise and sampling frequency of the system) the steady state error in the wafer temperature will not be zero. In order to achieve the correct value of steady state temperature, which is critical to the success of the algorithm, the control law given by Equation (14b) can be expressed in the following time-discrete format:

$$z^n = f(\dot{T}_t^n, T_t^n) + \Delta z^{n-1} \tag{25}$$

where superscripts (n−1) and (n) are used to denote quantities evaluated at times t and t−Δt, respectively. Here, Δt is one over the sampling frequency of the filtered temperature data. Note that for simplicity of the present analysis $\tau_{cc}$ is set to infinity. In the description that follows the system can employ finite gains. The quantity Δz is added to the value of z, mainly in order to zero-out the steady state error, and is given by:

$$\Delta z^{n-1} = z^{n-1} - f(\dot{T}^{n-1}, T^{n-1}) \tag{26}$$

Observe that in steady state where $\dot{T}=0$, $T_t=T_{ss}$, T(n)=T(n−1), and z(n)=z(n−1), Equation (26) forces T to equal $T_{ss}$:

$$z^n - z^{n-1} = f(T_t^n) - f(T^{n-1}) = f(T_{ss}) - f(T^n) = 0 \tag{27}$$

That is, by adding Δz the system 10 ensures that in steady state T→$T_{ss}$.

Next, standard analysis is used to show the dynamic behavior of the control algorithm. Again, assume q=$q_o$z/H, and expand all quantities evaluated at time step n in Equations (25) and (26) as follows:

$$F^n = F^{n-1} + \left(\frac{dF}{dt}\right)_{n-1} \Delta t + \ldots$$

In all practical situations the sampling frequency is large enough such that $\Delta t/\tau_T \ll 1$. Thus, terms of the order of $\Delta t/\tau_T$ can be neglected. The final result is given by:

$$\dot{T} = \frac{1}{\tau_T}(T^4 - T_t^4) \tag{28}$$

where, as before, $\ddot{T}=T_t-T$ and $\tau_T=h\rho C/(2\epsilon\sigma T_t^3)$. Equations (27) and (28) indicate that the effect of adding the Δz term is to obtain better trajectory tracking (on the thermal time scale), and more importantly to achieve the correct steady state value. For example, if gains of 0, 1 and 2 are employed, and the heat input used in the model is assumed to be offset by 10% (just as in the case presented in FIG. 8A), the tracking response of the control facility can be expressed by Equation (25). In this case, the steady state error tends to zero for the foregoing gains, specially as the gain (1/$\tau_{cc}$) is increased. Furthermore, when the gain is larger than one, the tracking error everywhere remains within about ±1° C.

One important factor in using Equation (28) is the need to have time derivatives of the temperature. During operation, the value of the wafer temperature is given by the pyrometer 54, where both white (un-correlated) and correlated noise are present.

Finally, the control facility 30 when employing Equations (25) and (26) is adaptive in nature, since the control algorithm employed thereby corrects for the predicted value of z based on differences between the predicted ($T_t$) from the temperature profile and the actual (T) of temperature and associated time derivatives. However, this algorithm differs from conventional techniques where the value of key parameters in a model are constantly updated based on the difference between model predictions and measurements. The approach presented herein simultaneously corrects for all parameter uncertainties in the model, and is therefore more robust and easier to implement.

Control Algorithm Implementation

The control algorithm employed by the control facility 30 of the wafer processing system 10 uses the notation $T_p$ to represent the pyrometer reading. The combination of the algorithms given by Equations (14b) and (25) can be expressed as follows:

$$z^n = f\left(\dot{T}_t^n + \frac{T_t^{n-1} - T_p^{n-1}}{\tau_{cc}}, T_t^n\right) + \Delta z^{n-1} \tag{29}$$

where, just as before $$\Delta z^{n-1} = z^{n-1} - f(\dot{\hat{T}}_p^{n-1}, T_p^{n-1}) \tag{30}$$

Note that in Equation (30) the term $\hat{T}_p$ is used as opposed to $\dot{T}_p$ in order to avoid all the difficulties that arise when trying to obtain a smooth time derivative of the pyrometer data. The quantity $\hat{T}_p$ is given by the following equation:

$$h\rho C \frac{d\hat{T}_p}{dt} = -2\epsilon\sigma \hat{T}_p^4 + \epsilon[q_t(z) + q_b(z)] + h\rho C \frac{(T_p - \hat{T}_p)}{\tau_m} \tag{31}$$

where the last term on the right hand side is the usual forcing term used to get a better agreement between the model and the measurement. Also, all the material properties used in Equation (31) are that of pure silicon. Typical values used for $\tau_m$ are about 0.2–0.3 s.

In order to investigate the effectiveness of the "model-gain" term involving $\tau_m$ consider another set of simulation results, such as a wafer with top emissivity of 0.9. The tracking error for various values of gain (1/$\tau_{cc}$) varies as the model-gain is varied. According to the algorithm, $\tau_m$ influences the tracking error, and in order to comply with standard operational conditions of the wafer processing system 10, the model-gain can be higher than six. Those of ordinary skill will recognize that using substantially higher values of $\tau_m$ can create instabilities in the system due to the sampling frequency and the noise associated with the pyrometer 54.

Thus, the control algorithm of the control facility 30 contains feedback linearization together with an adaptive capability that allows for good trajectory tracking (sub 1.5° C.) with nominal or zero steady state errors. Specifically, this is done by using Equations (29)–(31) with the following gains: 1/$\tau_{cc}$=1–2 s$^{-1}$, and 1/$\tau_m \geq$5 s$^{-1}$.

Figure 10:
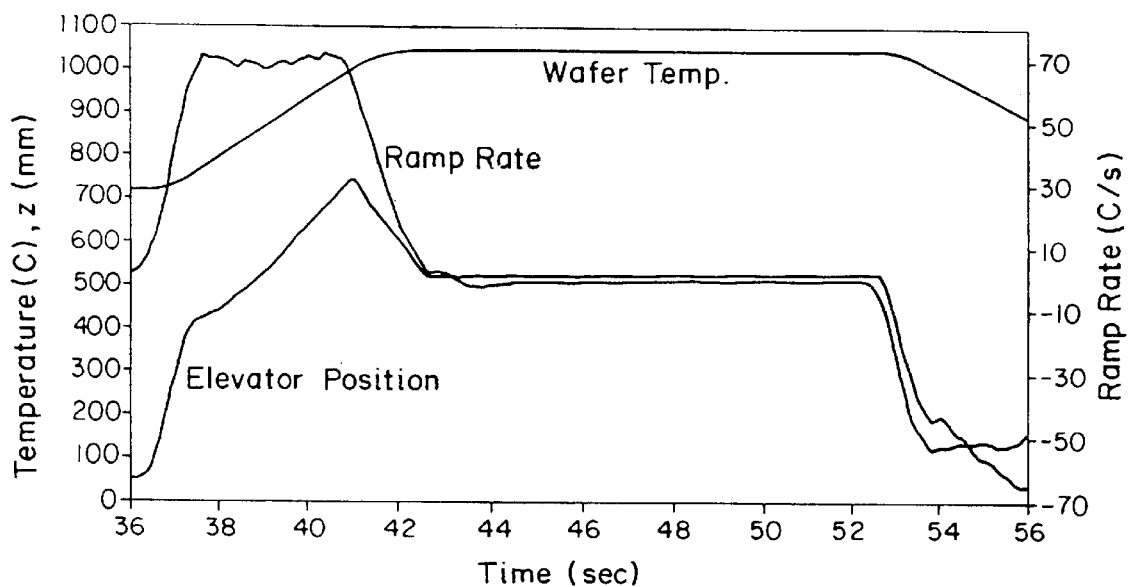
FIG. 10 is a schematic graphical illustration of the results of processing a silicon wafer according to a selected processing recipe with the wafer processing system of the present invention.
Figure 11:
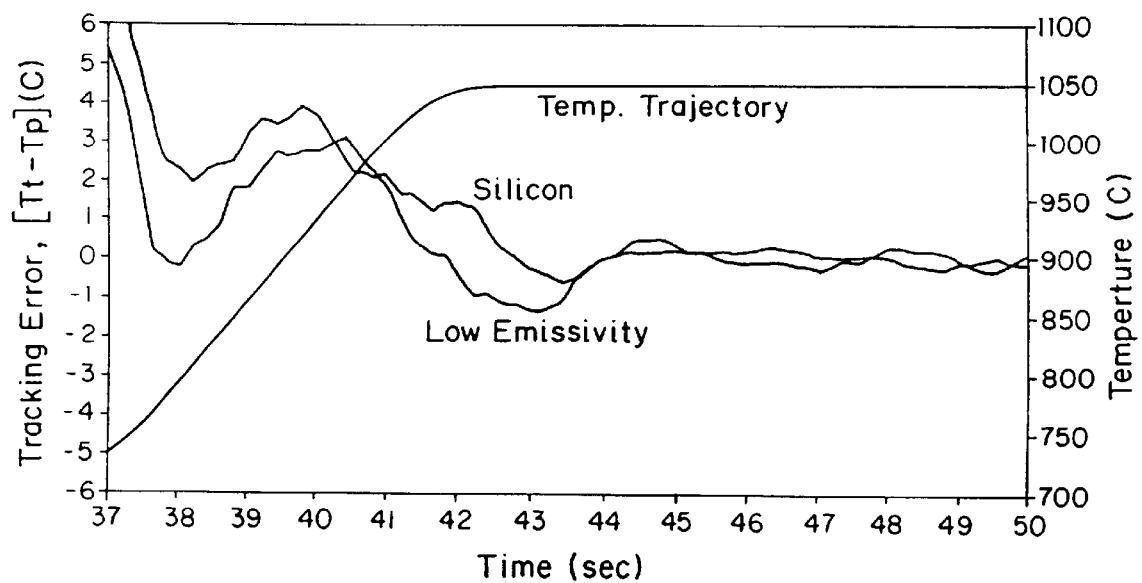
FIG. 11 is a schematic graphical illustration of the tracking error present when processing a selected silicon wafer according to a selected processing recipe with the wafer processing system of the present invention.

By way of example, the control facility 30 can be employed to ensure accurate tracking of the temperature during use. In FIG. 10, the system operation is shown for a pure silicon wafer with the same furnace setting as presented in FIG. 6. In this example, the ramp-up rate is 70° C./s and the ramp-down rate is −50° C./s. Furthermore, $T_{ss}$=1050° C., $\tau_R$=1.5 s, $\tau_{cc}$=1.0 s, and $\tau_m$=0.2 s. As shown, the wafer temperature ramp rate accurately follows the requested values. Hence, the control facility 30 accurately controls the processing of the wafer. In FIG. 11, the tracking error for both the silicon wafer as well as a wafer with a low top-emissivity is shown. The tracking error drops rapidly after the closed loop control begins. Then, the error value peaks at approximately 3–4° C. until the rollover in the temperature trajectory begins, after which it decreases to within about ±1° C. The steady state error is zero.

In general, the tracking error is consistent with the predictions from the examples and simulations described above. The reason for the high value of the tracking error at the start of the closed loop control is the mismatch between the actual pyrometer time derivative and the requested value of the ramp rate (70° C./s). That is, the system 10 accurately and adaptively moves the position of the wafer W to achieve the requested ramp rate, during which the tracking error increases. This phenomenon can be reduced by "blending in" the requested temperature trajectory. This is done by starting the temperature profile or trajectory at the same rate as that of the pyrometer, and then rapidly transition to the required rate.

Those of ordinary skill will recognize that the tracking error does not fall below the 1° C. level as predicted by the foregoing equations and models during the linear temperature ramp region, since the low sampling frequency together with the noise present in the pyrometer 54 prevents this from occurring. Both of these issues are resolved by upgrading the temperature measurement system to perform sampling at a higher rate, with less noise.

Figure 12A:
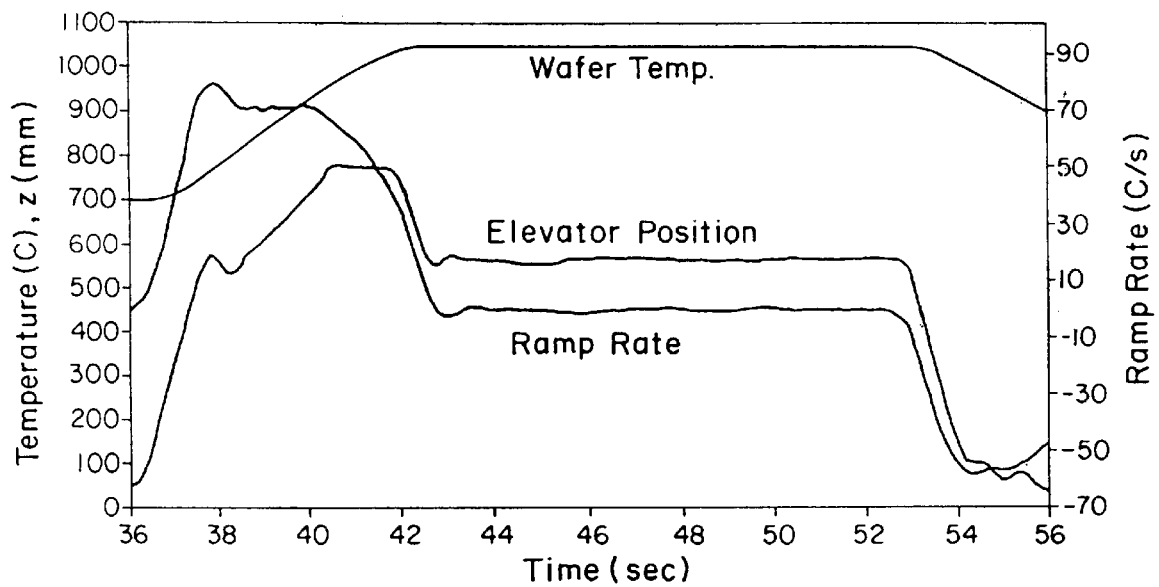
FIG. 12A is a schematic graphical illustration of the wafer processing system of the present invention operating in a saturation mode.
Figure 12B:
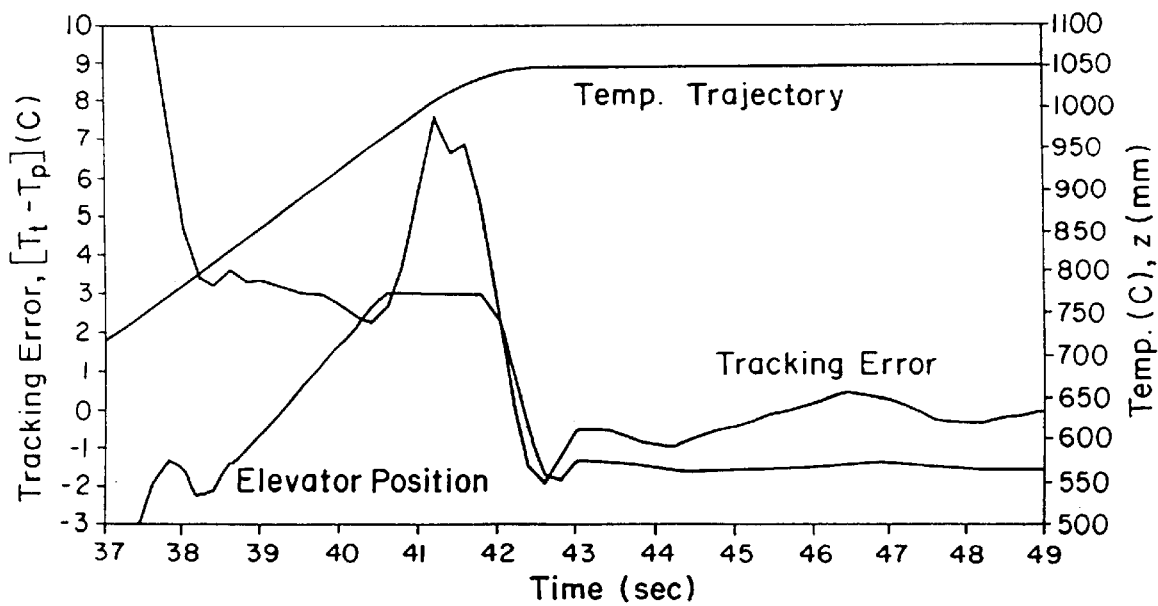
FIG. 12B is a schematic graphical illustration of the tracking error present when processing a selected silicon wafer according to a selected processing recipe with the wafer processing system of the present invention.

In FIG. 12A, the performance of the system for a wafer with a very low top emissivity is shown. The trajectory and the furnace settings are the same as in FIG. 10. Observe how, at a certain time during the "recipe", the elevator travels to the maximum allowable limit and stays there. The furnace settings in this case are not high enough to achieve the requested ramp rate, and as a result the elevator motion falls into a saturation mode. During the saturation period the ramp rate is no longer tracking the requested 70° C./s, and furthermore the tracking error increases substantially. This is clearly illustrated in FIG. 12B, where the tracking error is plotted as function of time. As the elevator comes out of saturation the tracking error rapidly approaches zero, with a maximum overshoot of 2° C. As discussed earlier, using higher gains ($1/\tau_{cc}$) results in higher overshoots. The results presented in FIG. 12B clearly indicate the robustness of the control facility and hence the system 10 against this type of scenario.

Figure 13A:
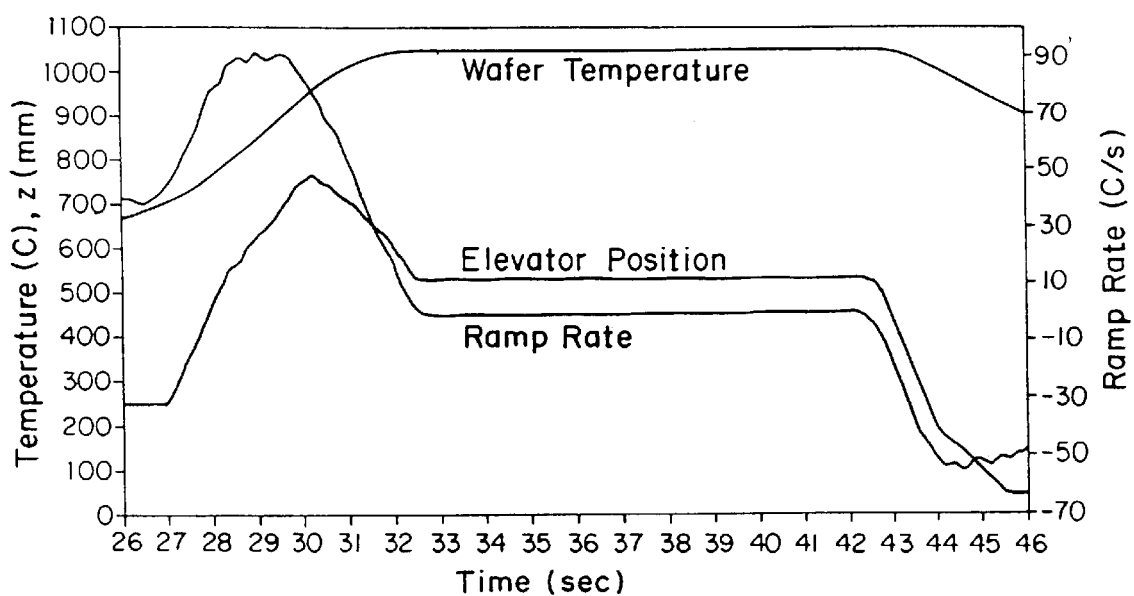
FIG. 13A is a schematic graphical illustration of a selected workpiece processing regimen using the wafer processing system of the present invention.
Figure 13B:
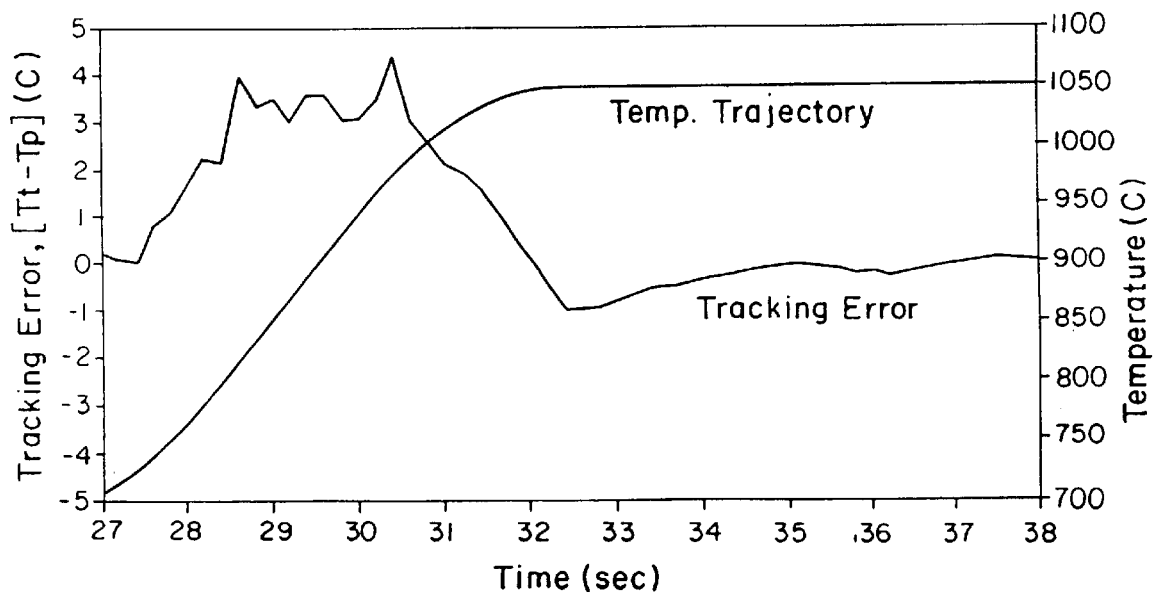
FIG. 13B is a schematic graphical illustration of the tracking error present when processing a selected silicon wafer according to a selected processing recipe with the wafer processing system of the present invention.

Additional examples for a silicon wafer are shown in FIGS. 13A and 13B. Here, all the parameters are the same as the cases presented in FIGS. 10–12, with the exception of the ramp-up rate which is 90° C./s (with ramp-down rate of −50° C./s), and the rollover time is 2.2 seconds. The figures, again, indicate highly effective trajectory tracking with an overshoot of less than 1° C.

Those of ordinary skill will recognize that various ramp rates and different gain parameters can be used while concomitantly achieving similar tracking capabilities. The illustrated wafer processing system 10 exhibits reliable trajectory tracking and minimal over/undershoots (≦2° C.) under a variety of different operating conditions and using wafers with varying surface characteristics. Furthermore, an important correlation has been presented that relates the elevator mechanical limitations to temperature overshoots. This correlation is used to draw-out the temperature trajectory (or redesign the motor) in order to optimize the system's performance while avoiding overshoots.

It will thus be seen that the invention efficiently attains the objects set forth above, among those made apparent from the preceding description. Since certain changes may be made in the above constructions without departing from the scope of the invention, it is intended that all matter contained in the above description or shown in the accompanying drawings be interpreted as illustrative and not in a limiting sense.

It is also to be understood that the following claims are to cover all generic and specific features of the invention described herein, and all statements of the scope of the invention which, as a matter of language, might be said to fall therebetween.

Having described the invention, what is claimed as new and desired to be secured by Letters Patent is:

1. A method for processing a workpiece in a thermal processing furnace according to an intended temperature profile, said method comprising the steps of
    measuring the temperature of the workpiece in the thermal processing furnace, and
    based upon the intended temperature profile and the measured temperature of the workpiece, regulating a position and a speed of the workpiece through the furnace to heat process the workpiece generally according to the intended temperature profile.

2. The method of claim 1, further comprising the step of providing an intended temperature profile of the workpiece to be generally achieved during processing in the thermal processing furnace.

3. The method of claim 1, further comprising the step of determining one or more selected set points of the thermal processing furnace, and then employing the set points to determine a target temperature of the workpiece.

4. The method of claim 3, further comprising the step of moving the workpiece through the furnace based upon the furnace set points, the intended temperature profile and the measured temperature of the workpiece.

5. The method of claim 1, further comprising the steps of
    providing a workpiece processing recipe,
    generating from said recipe the intended temperature profile, and
    controlling movement of the workpiece in the furnace to heat the workpiece generally according to the temperature profile.

6. The method of claim 1, wherein the step of providing the recipe comprises the step of selecting at last one of a temperature ramp-up rate, a temperature ramp-down rate, and a soak temperature.

7. The method of claim 6, further comprising the step of providing a relatively smooth transition between at least one of the temperature ramp-up rate and the soak temperature, and the temperature ramp-down rate and the soak temperature.

8. The method of claim 1, wherein the step of measuring comprises the steps of
    determining the emissivity of the workpiece, and
    based upon the emissivity of the workpiece, determining the temperature of the workpiece.

9. The method of claim 1, wherein the step of measuring the temperature comprises the step of providing an emissivity compensated pyrometry system to measure a parameter of the workpiece.

10. The method of claim 1, wherein the step of moving the workpiece comprises the step of providing an elevator for moving the workpiece through a process chamber.

11. The method of claim 10, further comprising the step of moving the elevator in response to the measured temperature of the workpiece.

12. The method of claim 1, wherein the step of measuring comprises the step of determining the temperature of the workpiece according to the following equation:

$$h\rho C(T)\frac{dT}{dt} = -(\varepsilon_t + \varepsilon_b)\sigma T^4 + \alpha_t q_t(z) + \alpha_b q_b(z).$$

13. The method of claim 1, wherein the measuring step further comprises the step of providing a feedback subsystem for sensing and measuring the temperature of the workpiece.

14. The method of claim 13, further comprising the steps of
determining the emissivity of the workpiece,
generating an output signal with a pyrometer indicative of the workpiece temperature,
filtering the output signal, and
based on the workpiece emissivity and the output signal, determining the workpiece temperature.

15. The method of claim 1, further comprising the steps of providing a control facility for controlling movement of the workpiece within the thermal processing furnace in response to the measured workpiece temperature.

16. The method of claim 1, further comprising the steps of
determining the difference between the measured temperature and an intended temperature from the temperature profile to form an error signal, and
based on the error signal, moving the workpiece within the thermal processing furnace with an elevator subsystem.

17. The method of claim 16, further comprising the step of scaling the error signal by a pre-determined value.

18. The method of claim 17, further comprising the step of
sampling the intended temperature profile at one or more points, and
determining one or more boundary conditions of the elevator subsystem based on the sampled points.

19. The method of claim 18, further comprising the step of determining one or more boundary conditions of the elevator subsystem based on the boundary condition.

20. The method of claim 19, further comprising the step of moving the workpiece at a selected speed within the chamber and within the boundary condition.

21. The method of claim 17, further comprising the step of sampling the intended temperature profile at one or more different points.

22. A system for processing a workpiece, comprising
a thermal processing furnace having a process chamber,
a feedback subsystem coupled to the thermal processing furnace for detecting a parameter of the workpiece when disposed in the processing chamber,
a control facility for generating a control signal to regulate a position and a speed of the workpiece based upon an intended temperature profile of the workpiece and the parameter of the workpiece, and
an elevator subsystem in communication with the control facility for moving the workpiece through the process chamber in response to the control signal to heat process the workpiece generally according to the intended temperature profile.

23. The system of claim 22, wherein said control facility is adapted to control the elevator subsystem to move the workpiece along an intended path through the processing chamber as a function of the intended temperature profile.

24. The system of claim 22, further comprising means for acquiring one or more selected set points of the thermal processing furnace.

25. The system of claim 22, further comprising a user interface for providing a workpiece processing recipe, wherein said recipe includes at least one of a temperature ramp-up rate, a temperature ramp-down rate, and a soak temperature.

26. The system of claim 24, wherein said control facility generates the control signal to move the workpiece through the furnace based upon the furnace set points, the intended temperature profile, and the measured temperature of the workpiece.

27. The system of claim 25, further comprising a trajectory generator for generating the intended temperature profile in response to the recipe.

28. The system of claim 22, wherein the control facility is adapted to determine the temperature of the workpiece according to the following equation:

$$h\rho C(T)\frac{dT}{dt} = -(\varepsilon_t + \varepsilon_b)\sigma T^4 + \alpha_t q_t(z) + \alpha_b q_b(z).$$

29. The system of claim 22, wherein said feedback subsystem comprises
a pyrometer for measuring the temperature of the workpiece,
an emissivity measurement stage for measuring the emissivity of the workpiece, and
a filtering stage for filtering one if the measured temperature and emissivity,
wherein said feedback subsystem generates a signal corresponding to the measured temperature of the workpiece.

30. The system of claim 22, further comprising a plurality of thermocouples for measuring the temperature of the furnace at one or more locations.

31. The system of claim 30, wherein said controller further comprises a furnace thermal properties stage for generating an output signal in response to a signal generated by the one or more thermocouples representative of the thermal properties of the thermal processing furnace.

32. The system of claim 31, wherein the controller further comprises a workpiece thermal properties stage for generating one or more signals indicative of one or more parameters of the workpiece in response to a workpiece position signal generated by the elevator subsystem and the output signal of the furnace thermal properties stage.

33. The system of claim 30, wherein the workpiece parameter comprises one of temperature and emissivity.

34. The system of claim 22, wherein the elevator subsystem generates an output signal indicative of a position of the workpiece, said system further comprising feedback means for inputting the output signal to the control facility.

35. The system of claim 30, wherein the one or more thermocouples generate an output signal that is input to the control facility.

36. The system of claim 22, further comprising a trajectory generator for generating the intended temperature profile and for inputting the profile to the control facility.

37. The system of claim 36, further comprising means for determining the difference between the measured temperature of the workpiece and an intended temperature from the temperature profile to form an error signal, wherein said elevator subsystem moves the workpiece within the thermal processing furnace based on the error signal.

38. The system of claim 37, further comprising scaling means for scaling the error signal by a pre-determined value.

39. The system of claim 38, further comprising sampling means for sampling the intended temperature profile at one or more points, and determination means for determining one or more boundary conditions of the elevator subsystem based on the sampled points.

40. The system of claim 39, further comprising means for determining one or more boundary conditions of the elevator subsystem based on the boundary condition.

41. The system of claim 40, further comprising means for moving the workpiece at a selected speed within the process chamber and within the boundary condition.

42. The system of claim 22, further comprising determination means for determining the difference between the measured temperature of the workpiece and an intended temperature from the temperature profile to form an error signal, scaling means for scaling the error signal by a pre-determined value, sampling means for sampling the intended temperature profile at one or more points, and determination means for determining one or more boundary conditions of the elevator subsystem based on the sampled points.

43. In a system for processing a workpiece in a thermal processing furnace, said method comprising the steps of providing the temperature of the workpiece in the thermal processing furnace, providing an intended temperature profile of the workpiece to be generally achieved during processing in the thermal processing furnace, and based upon the intended temperature profile and the measured temperature of the workpiece, regulating a position and a speed of the workpiece through the furnace to heat process the workpiece according to the intended temperature profile.

44. A method for processing a workpiece in a thermal processing furnace according to an intended temperature profile, said method comprising:

measuring the temperature of the workpiece in the thermal processing furnace;

determining the difference between the measured temperature and an intended temperature from the intended temperature profile to form an error signal; and regulating a position and a speed of the workpiece through the furnace, based on the error signal, to heat process the workpiece generally according to the intended temperature profile.

* * * * *